United States Patent
Lee et al.

(10) Patent No.: US 10,651,402 B2
(45) Date of Patent: May 12, 2020

(54) ORGANOMETALLIC COMPOUND AND ORGANIC LIGHT-EMITTING DEVICE INCLUDING THE SAME

(71) Applicant: SAMSUNG ELECTRONICS CO., LTD., Suwon-si, Gyeonggi-do (KR)

(72) Inventors: Kum Hee Lee, Suwon-si (KR); Kyuyoung Hwang, Anyang-si (KR); Yoonhyun Kwak, Seoul (KR); Ohyun Kwon, Yongin-si (KR); Aram Jeon, Suwon-si (KR); Hyeonho Choi, Seoul (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 283 days.

(21) Appl. No.: 15/270,703

(22) Filed: Sep. 20, 2016

(65) Prior Publication Data

US 2017/0098788 A1    Apr. 6, 2017

(30) Foreign Application Priority Data

Oct. 1, 2015   (KR) .................. 10-2015-0138594

(51) Int. Cl.
| | |
|---|---|
| H01L 51/50 | (2006.01) |
| H01L 51/00 | (2006.01) |
| C07F 15/00 | (2006.01) |
| C09K 11/06 | (2006.01) |
| H01L 51/52 | (2006.01) |

(52) U.S. Cl.
CPC ...... *H01L 51/0085* (2013.01); *C07F 15/0033* (2013.01); *C09K 11/06* (2013.01); *C09K 2211/1029* (2013.01); *C09K 2211/185* (2013.01); *H01L 51/5016* (2013.01); *H01L 51/5206* (2013.01); *H01L 51/5221* (2013.01)

(58) Field of Classification Search
None
See application file for complete search history.

(56) References Cited

U.S. PATENT DOCUMENTS

| | | | |
|---|---|---|---|
| 6,998,492 B2 | 2/2006 | Seo et al. | |
| 2004/0230061 A1* | 11/2004 | Seo ..................... | C07F 15/0033 548/402 |
| 2014/0158993 A1 | 6/2014 | So et al. | |

FOREIGN PATENT DOCUMENTS

| | | | | |
|---|---|---|---|---|
| JP | 2004-155728 A | | 6/2004 | |
| JP | 2007-031678 | * | 2/2007 | ............. H01L 51/50 |
| JP | 2007-031678 A | | 2/2007 | |

* cited by examiner

*Primary Examiner* — Gregory D Clark
(74) *Attorney, Agent, or Firm* — Cantor Colburn LLP

(57) ABSTRACT

An organometallic compound represented by Formula 1:

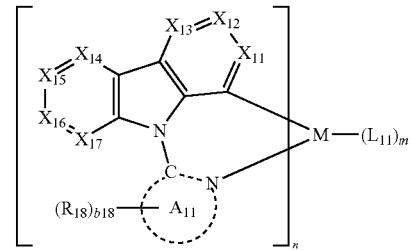

Formula 1 wherein, in Formula 1, b18, $A_{11}$, $L_{11}$, M, m, $R_{18}$, and $X_{11}$ to $X_{17}$ are the same as described in the specification.

18 Claims, 1 Drawing Sheet

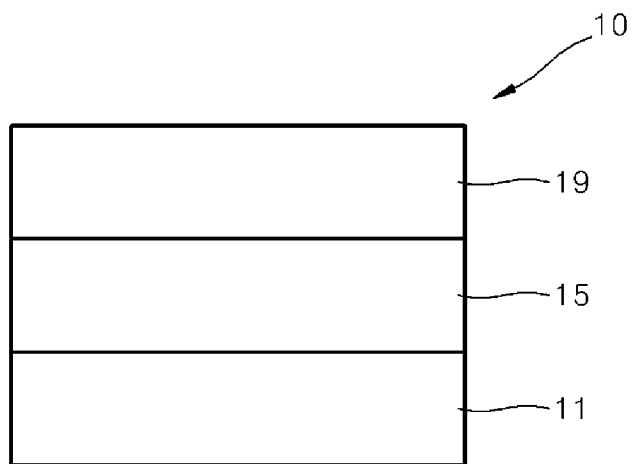

ORGANOMETALLIC COMPOUND AND ORGANIC LIGHT-EMITTING DEVICE INCLUDING THE SAME

CROSS-REFERENCE TO RELATED APPLICATION

This application claims priority to Korean Patent Application No. 10-2015-0138594, filed on Oct. 1, 2015, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound and an organic light-emitting device including the organometallic compound.

2. Description of the Related Art

Organic light-emitting devices (OLEDs) are self-emission devices that have wide viewing angles, high contrast ratios, and short response times. In addition, the OLEDs exhibit excellent luminance, driving voltage, and response speed characteristics, and produce full-color images.

A typical organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons are recombined in the emission layer to produce excitons. These excitons change from an excited state to a ground state to thereby generate light.

Various types of organic light emitting devices are known. However, there still remains a need in OLEDs having low driving voltage, high efficiency, high brightness, and long lifespan.

SUMMARY

Provided are an organometallic compound and an organic light-emitting device including the organometallic compound.

Additional aspects will be set forth in part in the description which follows and, in part, will be apparent from the description, or may be learned by practice of the presented exemplary embodiments.

According to an aspect of an exemplary embodiment, there is provided an organometallic compound represented by Formula 1:

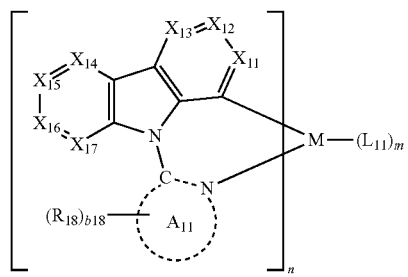

Formula 1 wherein, in Formula 1,

M is selected from a first-row transition metal, a second-row transition metal, and a third-row transition metal;

$A_{11}$ is selected from a $C_3$-$C_{20}$ heteropolycyclic group including a nitrogen atom (N) as a ring-forming atom;

$X_{11}$ is a nitrogen atom (N) or $CR_{11}$; $X_{12}$ is N or $CR_{12}$; $X_{13}$ is N or $CR_{13}$; $X_{14}$ is N or $CR_{14}$; $X_{15}$ is N or $CR_{15}$, $X_{16}$ is N or $CR_{16}$; $X_{17}$ is N or $CR_{17}$;

$R_{11}$ to $R_{18}$ are each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C(=O)($Q_1$), —N($Q_1$)($Q_2$), and —Si($Q_1$)($Q_2$)($Q_3$), wherein at least two adjacent groups of $R_{11}$ to $R_{17}$ are optionally linked to each other to form a saturated or unsaturated ring;

$Q_1$ to $Q_3$ are each independently selected from a hydrogen, deuterium, a substituted or unsubstituted $C_1$-$C_{10}$ alkyl group, and a substituted or unsubstituted $C_6$-$C_{60}$ aryl group;

b18 is selected from 1, 2, 3, 4, 5, 6, 7, and 8;

n is 1, 2, 3, and 4;

$L_{11}$ is selected from a monodentate ligand and a bidentate ligand; and m is selected from 0, 1, 2, 3, 4, 5, and 6.

According to an aspect of another exemplary embodiment, an organic light-emitting device includes:

a first electrode;

a second electrode; and an organic layer disposed between the first electrode and the second electrode, wherein the organic layer includes an emission layer and at least one organometallic compound represented by Formula 1 above.

BRIEF DESCRIPTION OF THE DRAWING

These and/or other aspects will become apparent and more readily appreciated from the following description of the exemplary embodiments, taken in conjunction with the accompanying drawings in which:

FIG. 1 is a schematic view illustrating a structure of an organic light-emitting device according to an embodiment.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which exemplary embodiments are shown. The inventive concept may, however, be embodied in many different forms and should not be construed as being limited to the embodiments set forth herein; rather, these embodiments are provided so that this disclosure will be thorough and complete, and will fully convey the effects and features of the present disclosure and ways to implement the present disclosure will fully convey the concept of the invention to those skilled in the art.

In the drawings, like reference numerals denote like elements throughout, and thus redundant description thereof will be omitted.

As used herein, the singular forms "a," "an," and "the" are intended to include the plural forms as well, unless the context clearly indicates otherwise.

The term "or" means "and/or." As used herein, the terms such as "comprises" and/or "comprising" or "includes" and/or "including", or "has" and/or "having", or the like are intended to indicate the existence of the features, regions, integers, steps, operations, components, or elements disclosed in the specification, and are not intended to preclude the possibility that one or more other features, regions, integers, steps, operations, components, or elements may exist or may be added.

It will also be understood that when an element such as a layer, a region or a component is referred to as being "on" another layer or element, it can be directly on the other layer or element, or intervening layers, regions, or components may also be present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the sizes of elements are exaggerated or reduced for ease of description. The size or thickness of each element shown in the drawings are arbitrarily illustrated for better understanding or ease of description, and thus the present disclosure is not limited thereto "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

As used herein, the term "organic layer" refers to a single layer and/or a plurality of layers disposed between first and second electrodes of an organic light-emitting device. A material in the "organic layer" is not limited to an organic material.

According to an aspect of the present disclosure, there is provided an organometallic compound represented by Formula 1:

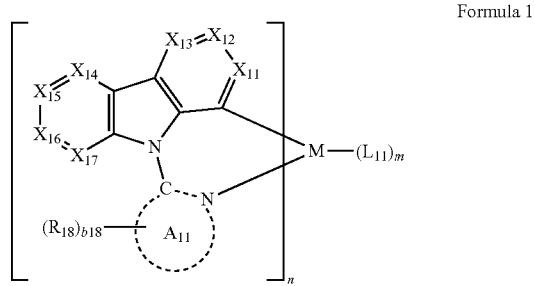

Formula 1

In Formula 1, M may be selected from a first-row transition metal, a second-row transition metal, and a third-row transition metal.

For example, in Formula 1, M may be selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm), but is not limited thereto.

In some embodiments, in Formula 1, M may be selected from Ir, Pt, Os, Ti, Zr, Hf, Eu, Tb, and Tm, but is not limited thereto.

In some other embodiments, in Formula 1, M may be selected from Ir, Pt, and Os, but is not limited thereto.

In Formula 1, $A_{11}$ may be selected from a $C_3$-$C_{20}$ heteropolycyclic group including a nitrogen atom (N) as a ring-forming atom. A heteropolycyclic group refers to a group with at least two condensed rings, and may further include a heteroatom (for example, oxygen atom, sulfur atom, or the like), in addition to N as an essential member element. In other words, $A_{11}$ in Formula 1 is not a heteromonocyclic group such as pyridine.

For example, in Formula 1, $A_{11}$ may be selected from a $C_3$-$C_{14}$ heterocyclic group condensed with a 6-membered ring group and a $C_3$-$C_{14}$ heterocyclic group condensed with a 5-membered ring group, and the $C_3$-$C_{14}$ heterocyclic group may include N as a ring-forming atom. However, embodiments are not limited thereto. The nitrogen atom (N) in a $C_3$-$C_{14}$ heterocyclic group may be linked to M in Formula 1.

For example, the $C_3$-$C_{14}$ heterocyclic group may be a $C_3$-$C_{14}$ heteromonocyclic group or a $C_3$-$C_{14}$ heteropolycyclic group.

For example, the $C_3$-$C_{14}$ heterocyclic group may be selected from a pyrrole group, a pyrazole group, an imidazole group, a thiazole group, an isothiazole group, an oxazole group, an iso-oxazole group, a pyridine group, a pyrimidine group, a pyrazine group, a triazine group, a thiazine group, an oxazine group, a quinoline group, an isoquinoline group, a cinnoline group, a quinazoline group, a quinoxaline group, 1,5-naphthyridine group, 1,6-naphthyridine group, 1,7-naphthyridine group, 1,8-naphthyridine group, a phthalazine group, 2,6-naphthyridine group, and 2,7-naphthyridine group, but is not limited thereto.

For example, the 6-membered ring group condensed to a $C_3$-$C_{14}$ heterocyclic group may be selected from a benzene group, a cyclohexane group, a cyclohexene group, a pyridine group, a piperidine group, a pyrazine group, a hexahydropyrimidine group, a tetrahydropyrazine group, and a piperazine group, but is not limited thereto.

For example, the 5-membered ring group condensed to a $C_3$-$C_{14}$ heterocyclic group may be selected from a cyclopentene group, a cyclopentadiene group, a dihydropyrrole group, a pyrrole group, an imidazole group, and a pyrrolidine group, but is not limited thereto.

In some embodiments, $A_{11}$ in Formula 1 may be selected from a quinoline group, an isoquinoline group, a cinnoline group, a quinazoline group, a quinoxaline group, 1,5-naphthyridine group, 1,6-naphthyridine group, 1,7-naphthyridine group, 1,8-naphthyridine group, a phthalazine group, 2,6-naphthyridine group, 2,7-naphthyridine group, an indole group, an isoindole group, a benzimidazole group, a benzothiazole group, a benzisothiazole group, a benzoxazole group, a benzisoxazole group, a benzothiazine group, a benzoxazine group, a benzoquinoline group, a benzisoquinoline group, a phenanthroline group, and a phenanthridine group, but is not limited thereto.

In some other embodiments, $A_{11}$ in Formula 1 may be selected from a quinoline group, an isoquinoline group, a quinazoline group, a quinoxaline group, 1,5-naphthyridine group, 1,6-naphthyridine group, 1,7-naphthyridine group, 1,8-naphthyridine group, a phthalazine group, 2,6-naphthyridine group, 2,7-naphthyridine group, an indole group, an isoindole group, a benzimidazole group, a benzothiazole group, a benzisothiazole group, a benzoxazole group, a benzisoxazole group, a benzothiazine group, and a benzoxazine group, but is not limited thereto.

For example, $A_{11}$ in Formula 1 may be selected from a quinoline group, an isoquinoline group, an indole group, and a benzimidazole group, but is not limited thereto.

For example, $A_{11}$ in Formula 1 may be selected from a quinoline group, an isoquinoline group, and a benzimidazole group, but is not limited thereto.

In some embodiments, in Formula 1, $X_{11}$ may be a nitrogen atom (N) or $CR_{11}$, $X_{12}$ may be N or $CR_{12}$, $X_{13}$ may be N or $CR_{13}$, $X_{14}$ may be N or $CR_{14}$, $X_{15}$ may be N or $CR_{15}$, $X_{16}$ may be N or $CR_{16}$, and $X_{17}$ may be N or $CR_{17}$.

For example, in Formula 1, $X_{11}$ may be N, $X_{12}$ may be $CR_{12}$, $X_{13}$ may be $CR_{13}$, $X_{14}$ may be $CR_{14}$, $X_{15}$ may be $CR_{15}$, $X_{16}$ may be $CR_{16}$, and $X_{17}$ may be $CR_{17}$;

$X_{11}$ may be $CR_{11}$, $X_{12}$ may be N, $X_{13}$ may be $CR_{13}$, $X_{14}$ may be $CR_{14}$, $X_{15}$ may be $CR_{15}$, $X_{16}$ may be $CR_{16}$, and $X_{17}$ may be $CR_{17}$;

$X_{11}$ may be $CR_{11}$, $X_{12}$ may be $CR_{12}$, $X_{13}$ may be N, $X_{14}$ may be $CR_{14}$, $X_{15}$ may be $CR_{15}$, $X_{16}$ may be $CR_{16}$, and $X_{17}$ may be $CR_{17}$;

$X_{11}$ may be $CR_{11}$, $X_{12}$ may be $CR_{12}$, $X_{13}$ may be $CR_{13}$, $X_{14}$ may be N, $X_{15}$ may be $CR_{15}$, $X_{16}$ may be $CR_{16}$, and $X_{17}$ may be $CR_{17}$;

$X_{11}$ may be $CR_{11}$, $X_{12}$ may be $CR_{12}$, $X_{13}$ may be $CR_{13}$, $X_{14}$ may be $CR_{14}$, $X_{15}$ may be N, $X_{16}$ may be $CR_{16}$, and $X_{17}$ may be $CR_{17}$;

$X_{11}$ may be $CR_{11}$, $X_{12}$ may be $CR_{12}$, $X_{13}$ may be $CR_{13}$, $X_{14}$ may be $CR_{14}$, $X_{15}$ may be $CR_{15}$, $X_{16}$ may be N, and $X_{17}$ may be $CR_{17}$;

$X_{11}$ may be $CR_{11}$, $X_{12}$ may be $CR_{12}$, $X_{13}$ may be $CR_{13}$, $X_{14}$ may be $CR_{14}$, $X_{15}$ may be $CR_{15}$, $X_{16}$ may be $CR_{16}$, and $X_{17}$ may be N; or $X_{11}$ may be $CR_{11}$, $X_{12}$ may be $CR_{12}$, $X_{13}$ may be $CR_{13}$, $X_{14}$ may be $CR_{14}$, $X_{15}$ may be $CR_{15}$, $X_{16}$ may be $CR_{16}$, and $X_{17}$ may be $CR_{17}$. However, embodiments are not limited thereto.

In some other embodiments, in Formula 1, $X_{11}$ may be $CR_{11}$, $X_{12}$ may be $CR_{12}$, $X_{13}$ may be $CR_{13}$, $X_{14}$ may be $CR_{14}$, $X_{15}$ may be $CR_{15}$, $X_{16}$ may be $CR_{16}$, and $X_{17}$ may be $CR_{17}$; or $X_{11}$ may be $CR_{11}$, $X_{12}$ may be $CR_{12}$, $X_{13}$ may be $CR_{13}$, $X_{14}$ may be $CR_{14}$, $X_{15}$ may be $CR_{15}$, $X_{16}$ may be $CR_{16}$, and $X_{17}$ may be N. However, embodiments are not limited thereto.

In Formula 1, $R_{11}$ to $R_{18}$ may be each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C(=O)($Q_1$), —N($Q_1$)($Q_2$), and —Si($Q_1$)($Q_2$)($Q_3$), wherein at least two adjacent groups of $R_{11}$ to $R_{17}$ may be optionally linked to each other to form a saturated or unsaturated ring; and $Q_1$ to $Q_3$ may be each independently selected from a hydrogen, deuterium, a substituted or unsubstituted $C_1$-$C_{10}$ alkyl group, and a substituted or unsubstituted $C_6$-$C_{60}$ aryl group.

For example, in Formula 1, $R_{11}$ to $R_{18}$ may be each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group;

a phenyl group, a naphthyl group, a fluorenyl group, a phenanlhrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzoluranyl group, a benzothiophenyl group, an isobenzothiazolyl group, a benzoxazolyl group, an isobenzoxazolyl group, a triazolyl group, a tetrazolyl group, an oxadiazolyl group, a Iriazinyl group, a dibenzofuranyl group, a dibenzothiophenyl group, a benzocarbazolyl group, a dibenzocarbazolyl group, and an imidazopyridinyl group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, a fluorenyl group, a phenanlhrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and —C(=O)(Q$_1$), —Si(Q$_1$)(Q$_2$)(Q$_3$), and —N(Q$_1$)(Q$_2$), wherein Q$_1$ to Q$_3$ may be each independently selected from substituted or unsubstituted C$_1$-C$_{20}$ alkyl groups. However, embodiments are not limited thereto.

In some embodiments, in Formula 1, $R_{11}$ to $R_{18}$ may be each independently selected from a hydrogen, deuterium, —F, —Cl, —Br, —I, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, an n-butoxy group, and tert-butoxy group;

a C$_1$-C$_{20}$ alkyl group and a C$_1$-C$_{20}$ alkoxy group, each substituted with at least one of deuterium, —F, —Cl, —Br, —I, a cyano group, a phenyl group, and a naphthyl group;

a phenyl group and a naphthyl group;

a phenyl group and a naphthyl group, each substituted with at least one of deuterium, —F, —Cl, —Br, —I, —CD$_3$, —CD$_2$H, —CDH$_2$, —CF$_3$, —CF$_2$H, —CFH$_2$, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, an n-butoxy group, a tert-butoxy group, a phenyl group, and a naphthyl group; and —Si(Q$_1$)(Q$_2$)(Q$_3$), wherein Q$_1$ to Q$_3$ may be each independently selected from a methyl group, an ethyl group, an n-propyl group, an iso-propyl group, an n-butyl group, an iso-butyl group, a sec-butyl group, and a tert-butyl group. However, embodiments are not limited thereto.

In some embodiments, in Formula 1, $R_{11}$ to $R_{17}$ may be a hydrogen. However, embodiments are not limited thereto.

In some other embodiments, in Formula 1, $R_{18}$ may be selected from a hydrogen, deuterium, —F, —Cl, —Br, —I, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, an n-butoxy group, a tert-butoxy group, —Si(CH$_3$)$_3$, and a phenyl group. However, embodiments are not limited thereto.

In Formula 1, b18, which indicates the number of groups $R_{18}$, may be selected from 1, 2, 3, 4, 5, 6, 7, and 8. When b18 is 2 or greater, groups $R_{18}$ may be the same or differ from one another.

In Formula 1, n indicates the number of ligands represented by

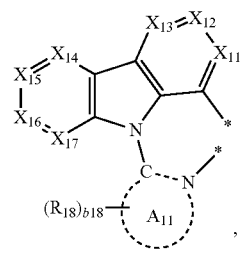

wherein * and *' may be each a binding site to M in Formula 1. In Formula 1, n may be selected from 1, 2, 3, and 4. When n is 2 or greater, the plurality of ligands may be the same or differ from one another.

For example, in Formula 1, n may be selected from 1, 2, and 3, but is not limited thereto.

In Formula 1, $L_{11}$ may be selected from a monodentate ligand and a bidentate ligand.

Non-limiting examples of the monodentate ligand are an iodide ion, a bromide ion, a chloride ion, a sulfide, a thiocyanate, a nitrate, an azide, a hydroxide, a cyanide ion, an isocyanide ion, water, acetonitrile, a pyridine, ammonia, carbon monoxide, $PPh_3$, $PPh_2CH_3$, $PPh(CH_3)_2$, and $P(CH_3)_3$.

Non-limiting examples of the bidentate ligand are an oxalate, acetylacetonate, picolinic acid, 2-(2-hydroxyphenyl)-pyridine, 2-phenylpyridine, 1,2-bis(diphenylphosphino)ethane (dppe), 1,1-bis(diphenylphosphino)methane (dppm), glycinate, ethylenediamine, 2,2'-bipyridine, and 1,10-phenanthroline.

For example, in Formula 1, $L_{11}$ may be a ligand represented by one of Formulae 2-1 to 2-5, but is not limited thereto:

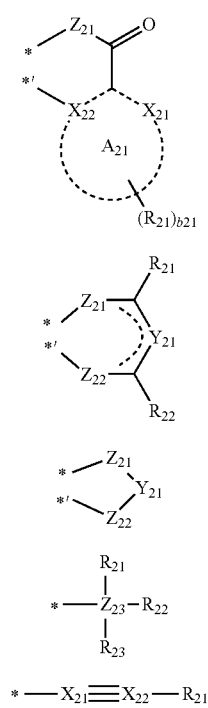

In Formulae 2-1 to 2-5, $A_{21}$ may be selected from a $C_5$-$C_{20}$ carbocyclic group and a $C_1$-$C_{20}$ heterocyclic group;

$X_{21}$ and $X_{22}$ may be each independently selected from C and N;

$Y_{21}$ may be selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group;

$Z_{21}$ and $Z_{22}$ may be each independently selected from N, O, $N(R_{25})$, $P(R_{25})(R_{26})$, and $As(R_{25})(R_{26})$;

$Z_{23}$ may be selected from P and As;

$R_{21}$ to $R_{26}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b21 to b24 may be each independently selected from 1, 2, and 3; and

* and *' may be each independently a binding site with an adjacent atom.

For example, in Formula 2-1, $A_{21}$ may be selected from a benzene group, a naphthalene group, a pyridine group, a pyrimidine group, a triazine group, a quinoline group, and an isoquinoline group, but is not limited thereto.

For example, in Formula 2-1, $X_{21}$ may be N, but is not limited thereto.

For example, in Formulae 2-2 and 2-3, $Y_{21}$ may be selected from a substituted or unsubstituted methylene group and a substituted or an unsubstituted phenylene group, but is not limited thereto.

For example, in Formulae 2-1 and 2-2, $Z_{21}$ and $Z_{22}$ may be 0, but are not limited thereto.

For example, in Formula 2-4, $Z_{23}$ may be P, but is not limited thereto.

For example, in Formulae 2-1 to 2-5, $R_{21}$ to $R_{26}$ may be each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzoluranyl group, a benzothiophenyl group, an isobenzothiazolyl group, a benzoxazolyl group, an isobenzoxazolyl group, a triazolyl group, a letrazolyl group, an oxadiazolyl group, a iriazinyl group, a dibenzofuranyl group, a dibenzothiophenyl group, a benzocarbazolyl group, a dibenzocarbazolyl group, and an imidazopyridinyl group, and a phenyl group, a naphthyl group, a fluorenyl group, a phenanlhrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzoluranyl group, a benzothiophenyl group, an isobenzothiazolyl group, a benzoxazolyl group, an isobenzoxazolyl group, a triazolyl group, a letrazolyl group, an oxadiazolyl group, a triazinyl group, a dibenzoturanyl group, a dibenzothiophenyl group, a benzocarbazolyl group, a dibenzocarbazolyl group, and an imidazopyridinyl group, each substituted with at least one of deuterium, —F, —Cl, —Br, —I, —CD$_3$, —CD$_2$H, —CDH$_2$, —CF$_3$, —CF$_2$H, —CFH$_2$, a hydroxy) group, a cyano group, a nitro group, an amino group, an amidino group a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzoluranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group. However, embodiments are not limited thereto.

In some embodiments, in Formula 1, L$_{11}$ may be a ligand represented by one of Formulae 3-1 to 3-6. However, embodiments are not limited thereto.

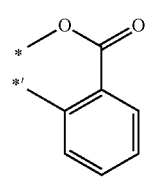

3-1

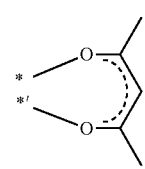

3-2

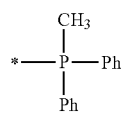

3-3

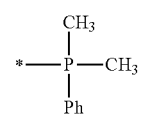

3-4

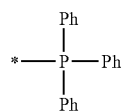

3-5

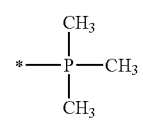

3-6

In Formulae 3-1 to 3-6,

Ph indicates a phenyl group; and

* and *' are each a binding site with an adjacent atom.

In Formula 1, m, which indicates the number of groups L$_{11}$, may be selected from 0, 1, 2, 3, 4, 5, and 6. When m is 2 or greater, the groups L$_{11}$ may be the same or differ from one another.

For example, in Formula 1, m may be selected from 0, 1, 2, 3, and 4, but is not limited thereto.

For example, the organometallic compound represented by Formula 1 may be a heteroleptic or homoleptic organometallic compound, but is not limited thereto.

For example, in Formula 1, M may be Ir, n may be 1, and m may be 2. However, embodiments are not limited thereto.

For example, in Formula 1, M may be Ir, n may be 2, and m may be 1. However, embodiments are not limited thereto.

For example, in Formula 1, M may be Ir, and n may be 3. However, embodiments are not limited thereto.

For example, in Formula 1, M may be Pt, n may be 1, and m may be 1. However, embodiments are not limited thereto.

For example, in Formula 1, M may be Os, n may be 2, and m may be 2. However, embodiments are not limited thereto.

The organometallic compound of Formula 1 may be represented by one of Formulae 1-1 to 1-4. However, embodiments are not limited thereto.

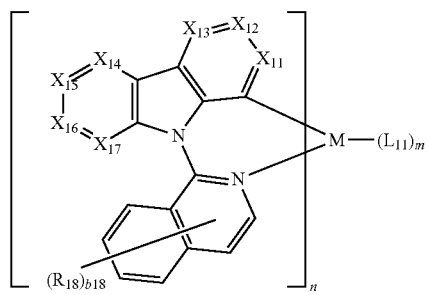

1-1

1-2
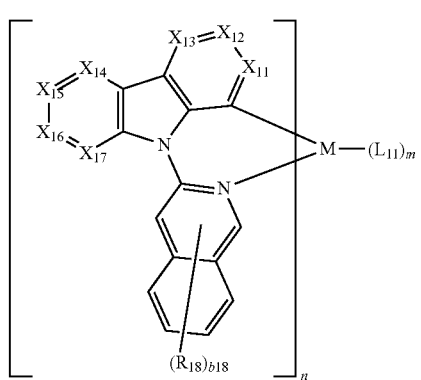
1-3
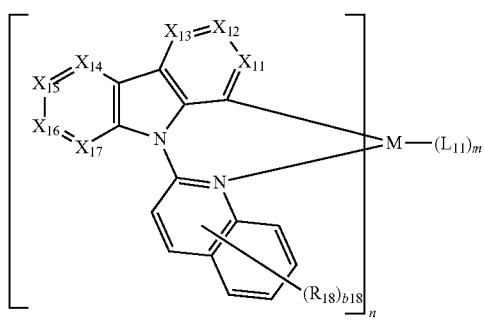
1-4
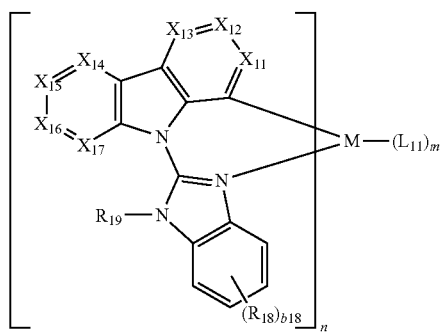
In Formulae 1-1 to 1-4,
M, $X_{11}$ to $X_{17}$, $R_{18}$, b18, n, $L_{11}$, and m may be defined the same as those in Formula 1; and
$R_{19}$ may be defined the same as $R_{18}$ in Formula 1.
The organometallic compound of Formula 1 may be represented by one of Formulae 1-11 to 1-18. However, embodiments are not limited thereto.
1-11
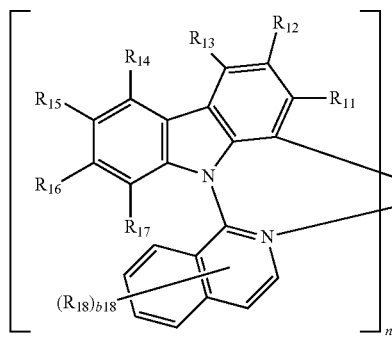
1-12
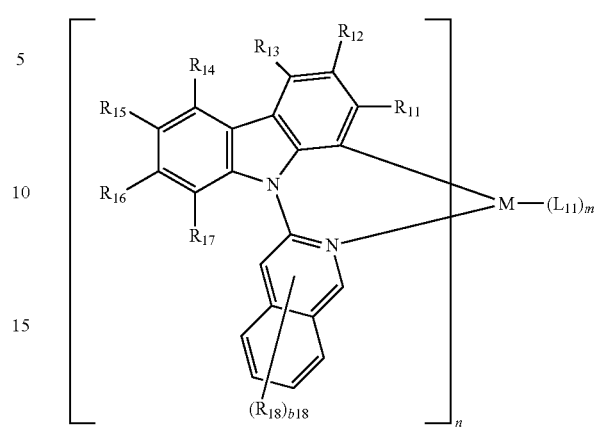
1-13
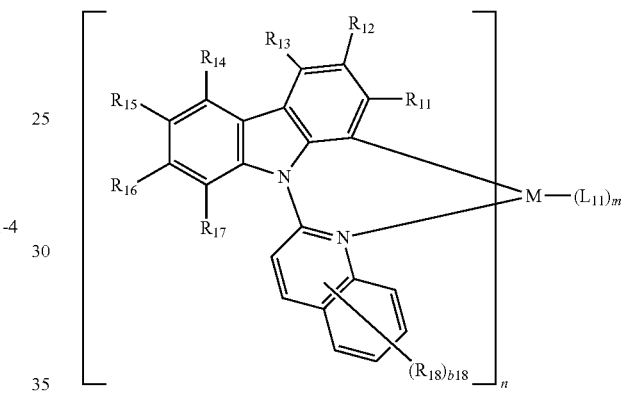
1-14
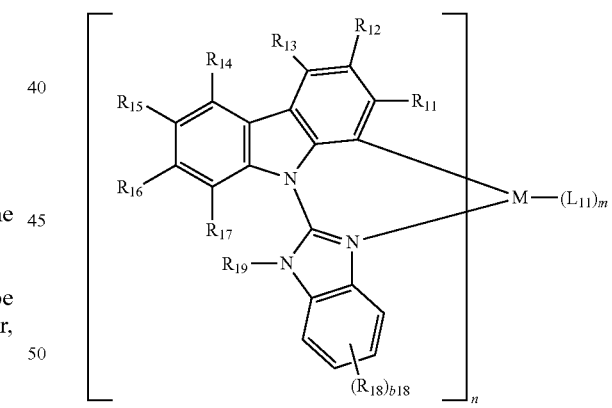
1-15
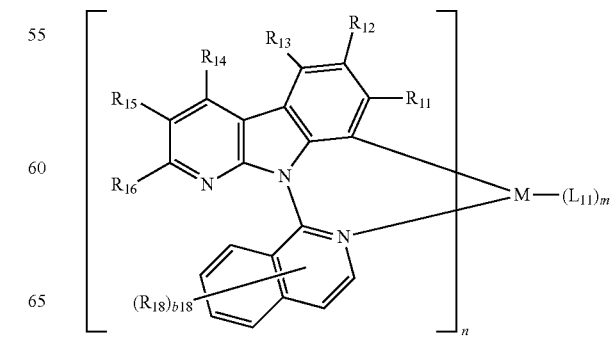

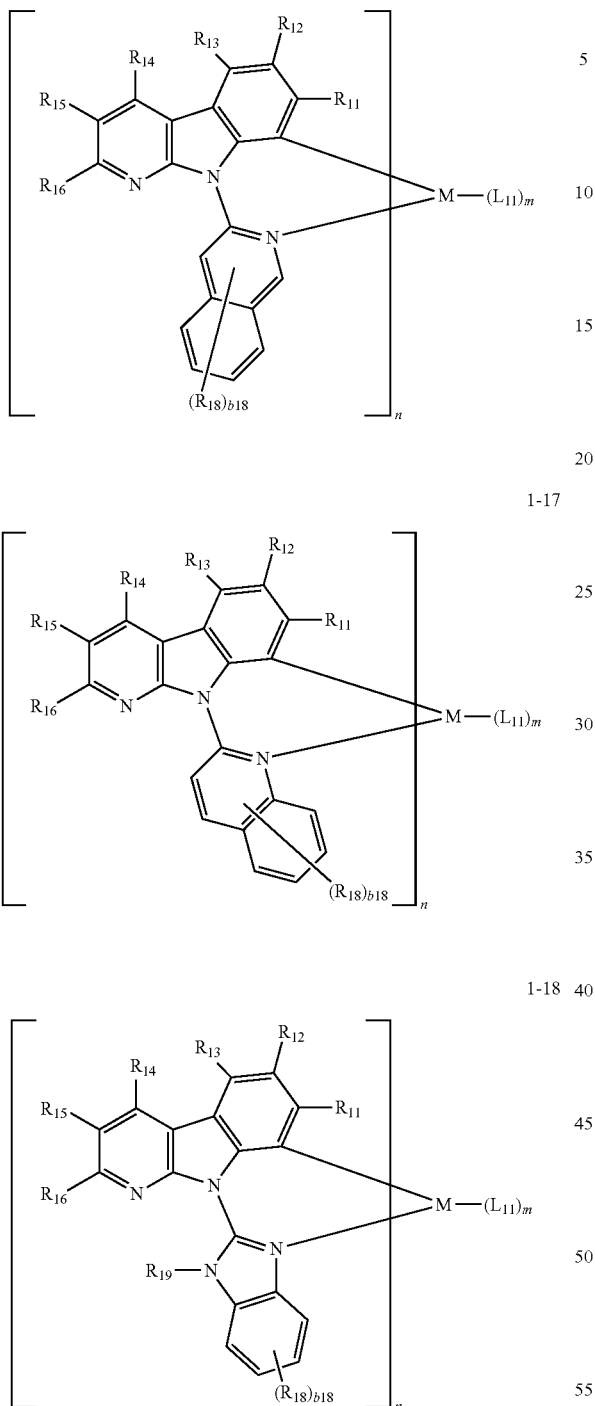
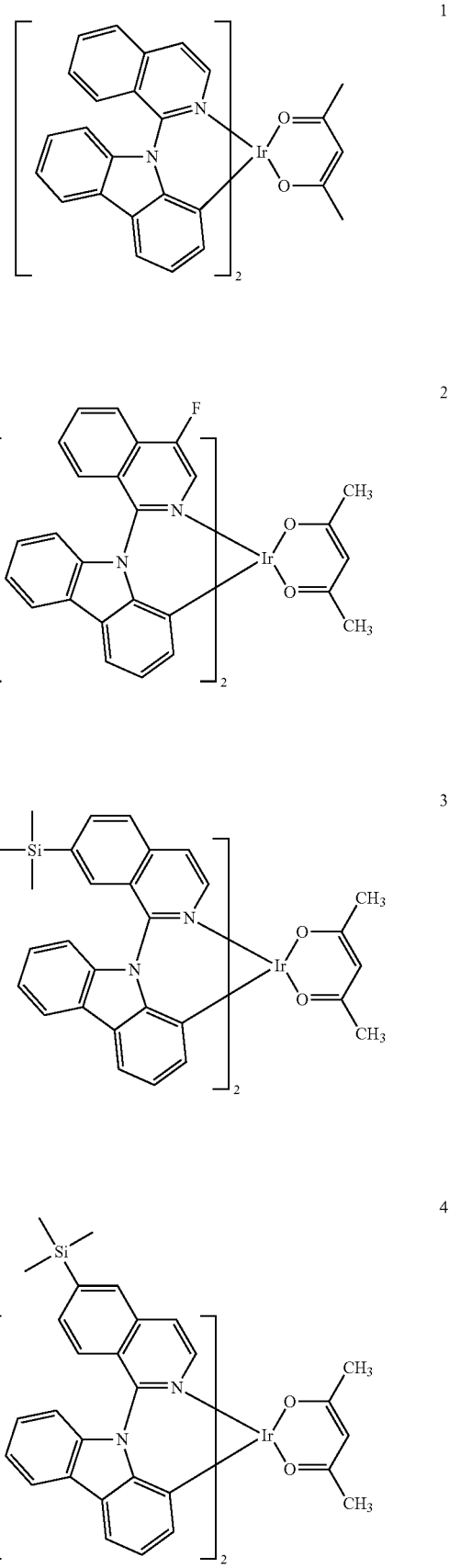
In Formulae 1-11 to 1-18,
M, $R_{11}$ to $R_{18}$, b18, n, $L_{11}$, and m may be the same as those defined in Formula 1;
$R_{19}$ may be defined the same as $R_{18}$ in Formula 1.
For example, in Formulae 1-11 to 1-18, n may be 2, but is not limited thereto.
The organometallic compound of Formula 1 may be selected from Compounds 1 to 30. However, embodiments are not limited thereto.

5
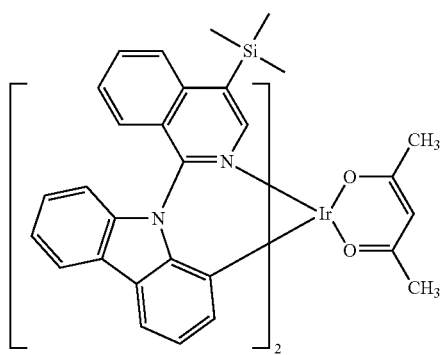
6
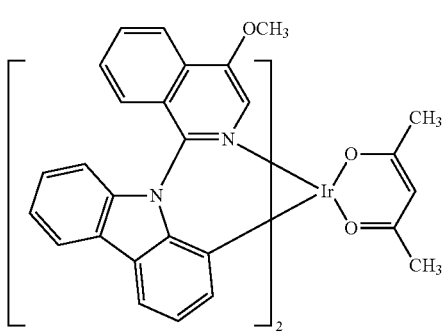
7
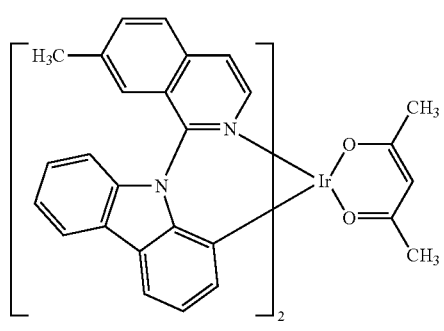
8
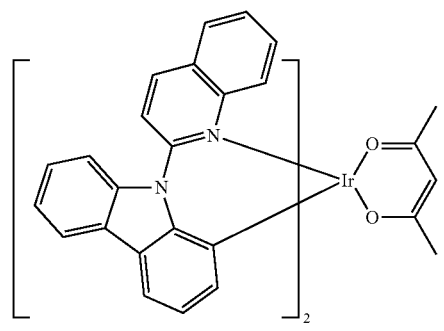
9
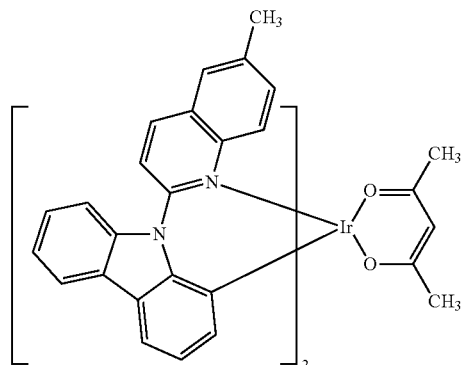
10
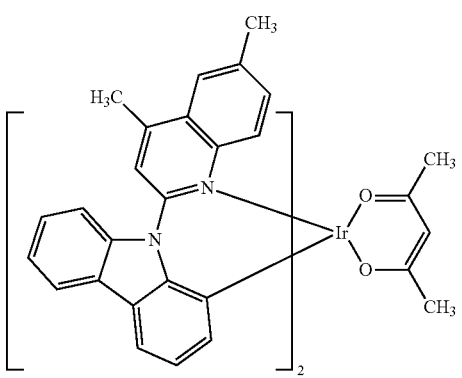
11
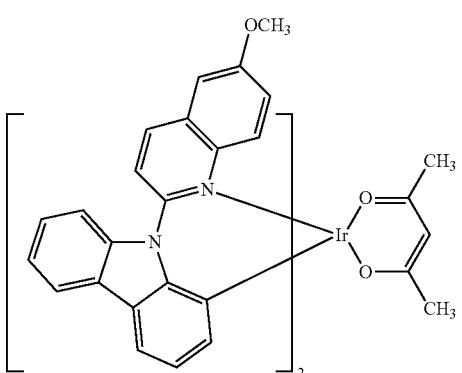
12
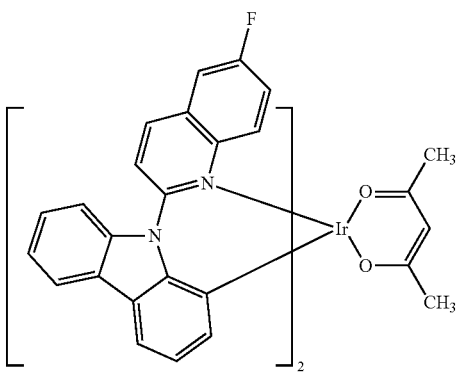

13
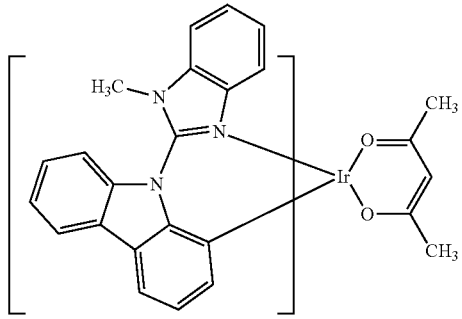
14
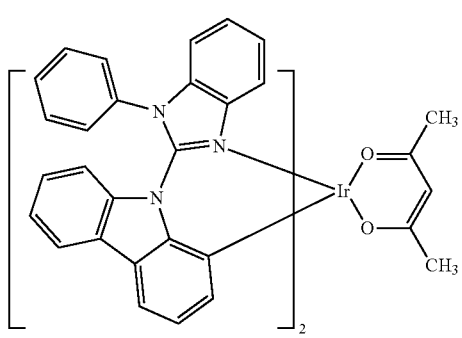
15
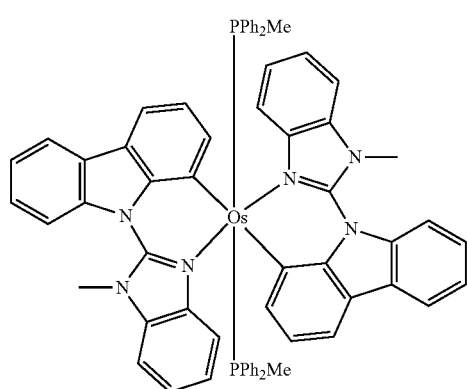
16
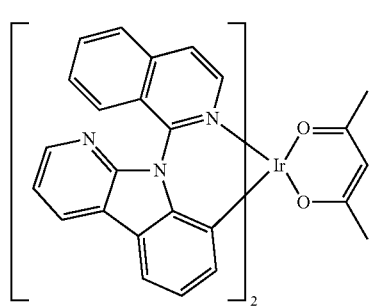
17
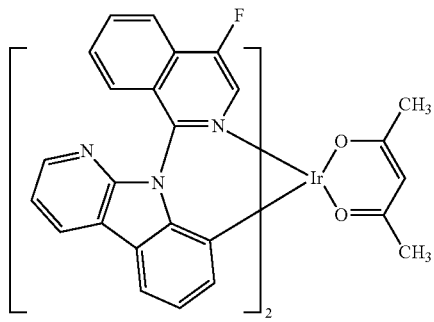
18
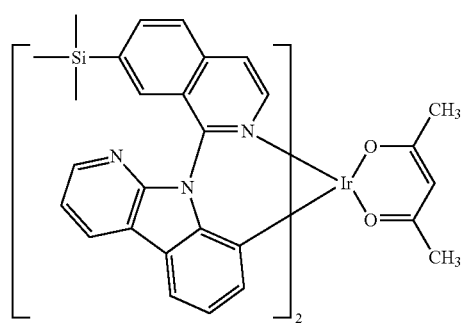
19
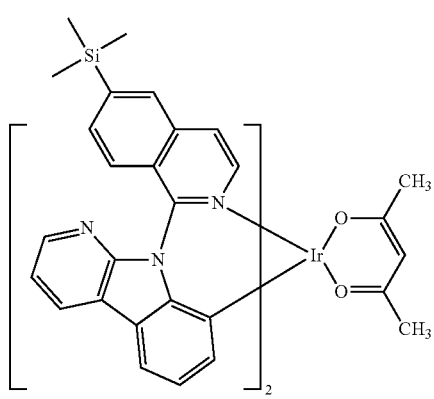
20
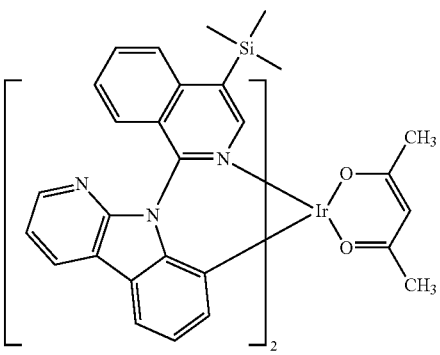

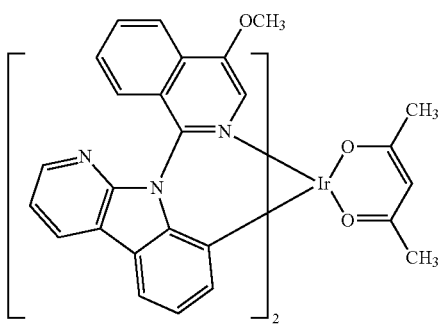
21
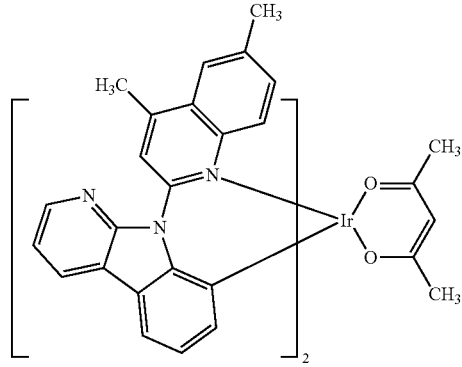
25
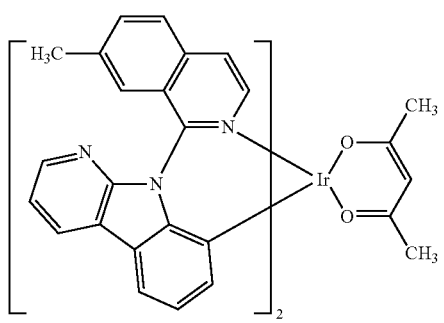
22
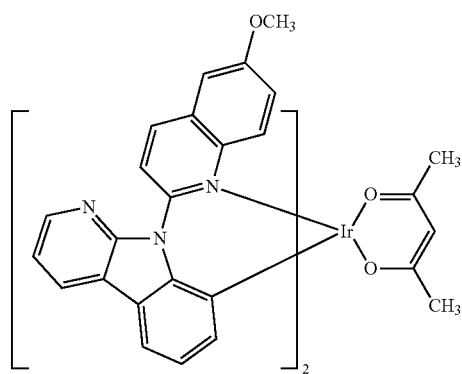
26
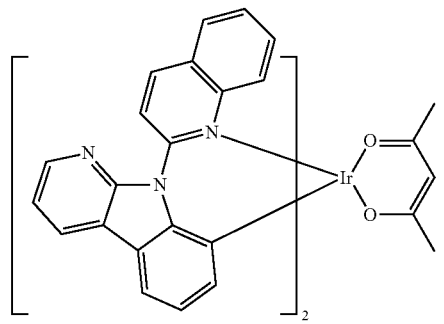
23
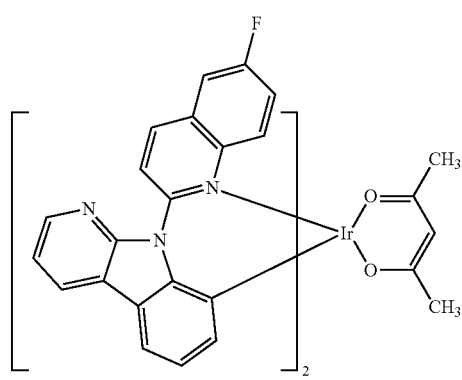
27
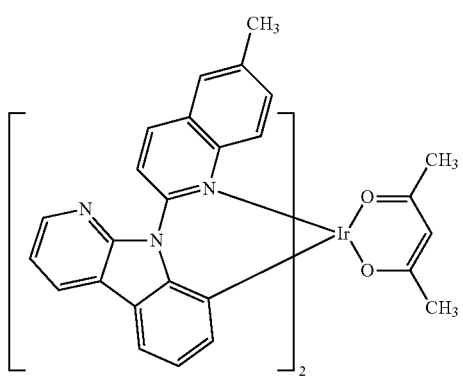
24
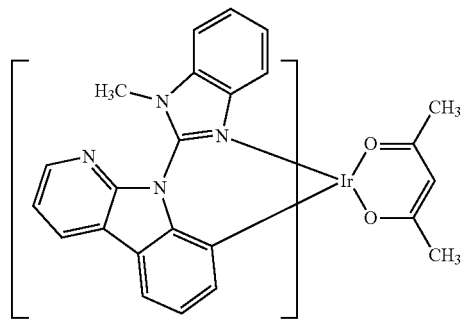
28

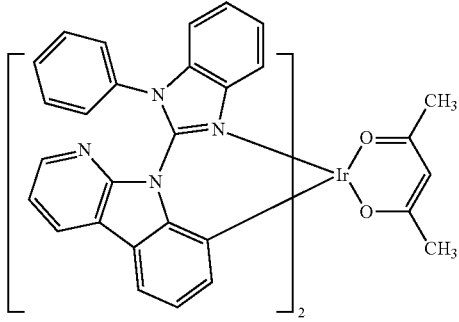

29

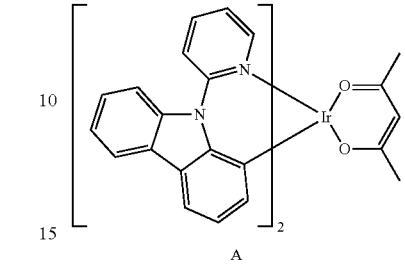

| Compound No. | HOMO (eV) | LUMO (eV) | T₁ (eV) |
|---|---|---|---|
| 29 | −4.515 | −0.874 | 2.777 |
| A | −4.691 | −1.298 | 2.528 |

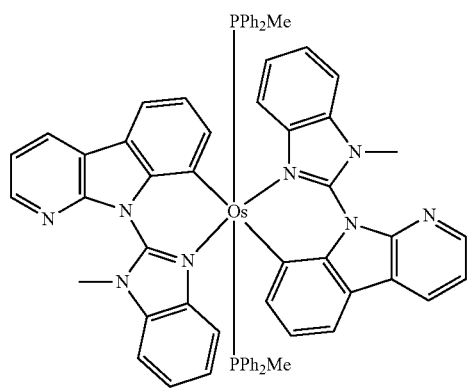

A

The organometallic compound represented by Formula 1 may essentially include a $C_3$-$C_{20}$ heteropolycyclic group, which may improve the charge mobility in the ligand. An organic light-emitting device including the organometallic compound represented by Formula 1 may have improved efficiency.

For example, the results of Gaussian simulation on the highest occupied molecular orbital (HOMO), the lowest unoccupied molecular orbital (LUMO), and the triplet ($T_1$) energy levels of some of Compounds 1 to 30 and Compound A are shown in Table 1.

TABLE 1

| Compound No. | HOMO (eV) | LUMO (eV) | T₁ (eV) |
|---|---|---|---|
| 1 | −4.683 | −1.770 | 2.057 |
| 2 | −4.758 | −1.867 | 2.014 |
| 3 | −4.671 | −1.723 | 2.093 |
| 6 | −4.610 | −1.683 | 2.077 |
| 8 | −4.641 | −1.764 | 2.104 |
| 9 | −4.593 | −1.694 | 2.121 |
| 10 | −4.538 | −1.612 | 2.153 |
| 11 | −4.543 | −1.657 | 2.1 |
| 12 | −4.758 | −1.945 | 2.038 |
| 13 | −4.552 | −0.801 | 2.819 |
| 28 | −4.619 | −0.914 | 2.758 |

A method of synthesizing the organometallic compound represented by Formula 1 may be obvious to one of ordinary skill in the art by referring to Synthesis Examples described herein.

The organometallic compound of Formula 1 may be appropriate for use as a material for an organic layer of an organic light-emitting device, for example, as a dopant of an EML.

According to another aspect of the present disclosure, an organic light-emitting device includes:
a first electrode,
a second electrode, and
an organic layer that is disposed between the first electrode and the second electrode, wherein the organic layer includes an emission layer (EML) and at least one of the organometallic compounds represented by Formula 1 according to any of the above-described embodiments.

The organometallic compound of Formula 1 may be used between a pair of electrodes of an organic light-emitting device. For example, the organometallic compound of Formula 1 may be included in the EML. The organometallic compound of Formula 1 may serve as a dopant in the EML, and the EML may further include a host (i.e., the amount of the organometallic compound of Formula 1 may be smaller than the amount of the host).

As used herein, "(for example, the organic layer) including at least one organometallic compound" means that "(the organic layer) including an organometallic compound of Formula 1, or at least two different organometallic compounds of Formula 1."

For example, the organic layer of the organic light-emitting device may include only Compound 1 as the organometallic compound. For example, Compound 1 may be included in the EML of the organic light-emitting device. In some embodiments, the organic layer of the organic light-emitting device may include Compounds 1 and 2 as the organometallic compound. For example, Compounds 1 and 2 may be included both in the EML.

The first electrode may be an anode as a hole injection electrode, and the second electrode may be a cathode as an electron injection electrode. In some embodiments, the first electrode may be a cathode as an electron injection electrode, and the second electrode may be an anode as a hole injection electrode.

For example, the first electrode may be an anode, the second electrode may be a cathode, and the organic layer may include: i) a hole transport region disposed between the first electrode and the emission layer, wherein the hole transport region includes at least one of a hole injection layer, a hole transport layer, and an electron blocking layer;

and ii) an electron transport region disposed between the emission layer and the second electrode, wherein the electron transport region includes at least one of a hole blocking layer, an electron transport layer, and an electron injection layer.

FIG. 1 is a schematic view of an organic light-emitting device 10 according to an embodiment of the present disclosure. Hereinafter, a structure of an organic light-emitting device according to an embodiment of the present disclosure and a method of manufacturing the same will now be described with reference to FIG. 1. Referring to FIG. 1, the organic light-emitting device 10 has a structure in which a first electrode 11, an organic layer 15, and a second electrode 19 are sequentially stacked in this order on a substrate (not shown).

The substrate (not shown) may be disposed under the first electrode 11 or on the second electrode 190 in FIG. 1. The substrate may be any substrate that is used in conventional organic light-emitting devices. In some embodiments, the substrate may be a glass substrate or a transparent plastic substrate with strong mechanical strength, thermal stability, transparency, surface smoothness, ease of handling, and water resistance.

The first electrode 11 may be formed by depositing or sputtering a first electrode-forming material on the substrate. The first electrode 11 may be an anode. A material having a high work function may be selected as a material for the first electrode 11 to facilitate hole injection. The first electrode 11 may be a reflective electrode, a semi-transmissive electrode, or a transmissive electrode. For example, the material for the first electrode 11 may be indium tin oxide (ITO), indium zinc oxide (IZO), tin oxide ($SnO_2$), or zinc oxide (ZnO). In some embodiments, the material for the first electrode 11 may be a metal, for example, magnesium (Mg), aluminum (Al), aluminum-lithium (Al—Li), calcium (Ca), magnesium-indium (Mg—In), magnesium-silver (Mg—Ag), or the like.

The first electrode 11 may have a single-layer structure or a multi-layer structure including at least two layers. For example, the first electrode 11 may have, but not limited to, a three-layered structure including ITO, Ag, and ITO layers.

The organic layer 15 may be disposed on the first electrode 11.

The organic layer 15 may include at least one a hole transport region; an EML, and an electron transport region.

The hole transport region may be disposed between the first electrode 11 and the EML.

The hole transport region may include at least one of a hole injection layer (HIL), a hole transport layer (HTL), an electron blocking layer (EBL), and a buffer layer.

The hole transport region may only include the HIL or the HTL. In some embodiments, the electron transport region may have a structure including a HIL/HTL or a HIL/HTL/EBL, wherein the layers forming the structure of the electron transport region may be sequentially stacked on the first electrode 10 in the stated order.

When the hole transport region includes the HIL, the HIL may be formed on the first electrode 11 by any of a variety of methods, for example, vacuum deposition, spin coating, casting, Langmuir-Blodgett (LB) deposition, or the like.

When the HIL is formed using vacuum deposition, vacuum deposition conditions may vary depending on the material that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Angstroms per second (Å/sec). However, the deposition conditions are not limited thereto.

When the HIL is formed using spin coating, the coating conditions may vary depending on the material that is used to form the HIL, and the desired structure and thermal properties of the HIL to be formed. For example, the coating rate may be in the range of about 2,000 revolutions per minute (rpm) to about 5,000 rpm, and a temperature at which heat treatment is performed to remove a solvent after coating may be in a range of about 80° C. to about 200° C. However, the coating conditions are not limited thereto.

Conditions for forming the HTL and the EBL may be the same as those for the HIL described above.

In some embodiments, the hole transport region may include at least one of m-MTDATA, TDATA, 2-TNATA, methylated NPB, β-NPB, TPD, Spiro-TPD, Spiro-NPB, α-NPB, TAPC, HMTPD, 4,4',4''-tris(N-carbazolyl)triphenylamine (TCTA), polyaniline/dodecylbenzene sulfonic acid (PANI/DBSA), poly(3,4-ethylenedioxythiophene)/poly(4-styrenesulfonate)(PEDOT/PSS), polyaniline/camphor sulfonic acid (PANI/CSA), polyaniline/poly(4-styrenesulfonate) (PANI/PSS), a compound represented by Formula 201, and a compound represented by Formula 202.

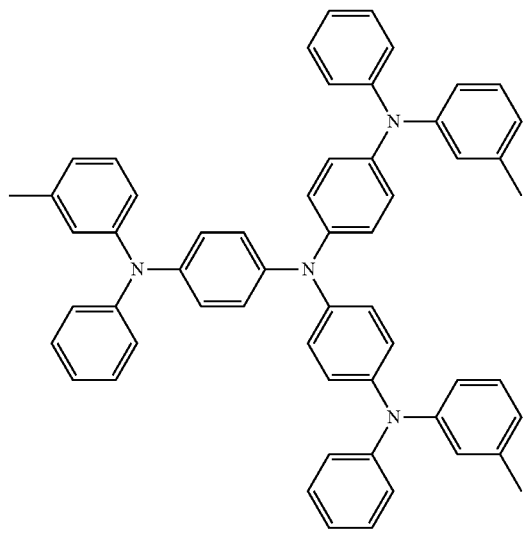

m-MTDATA

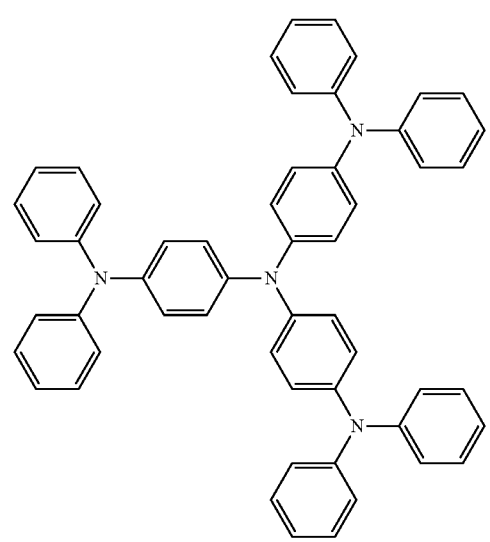

TDATA

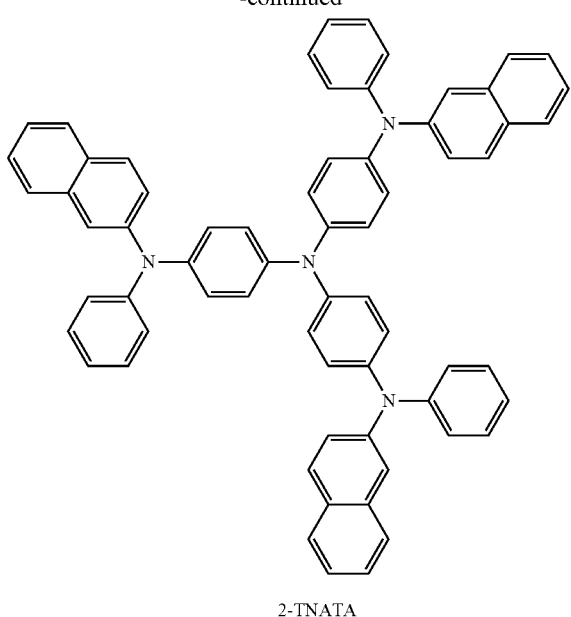
2-TNATA
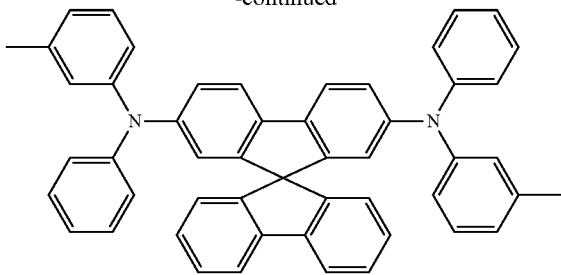
Sprio-TPD
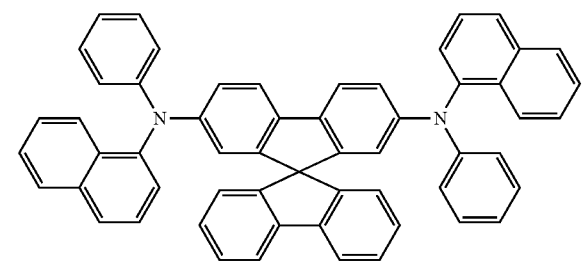
Sprio-NPB
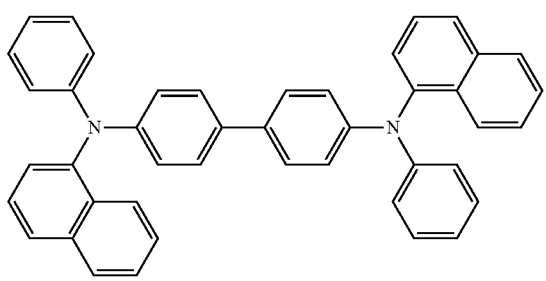
NPB
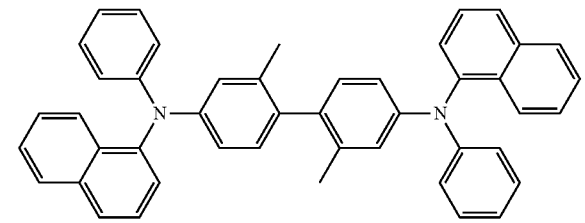
methylated NPB
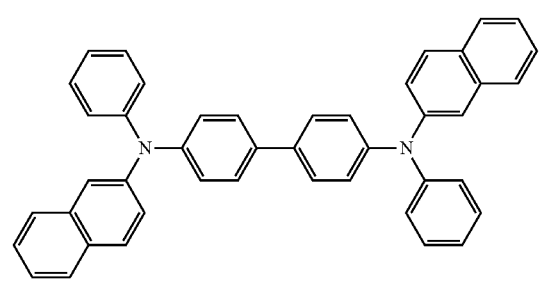
β-NPB
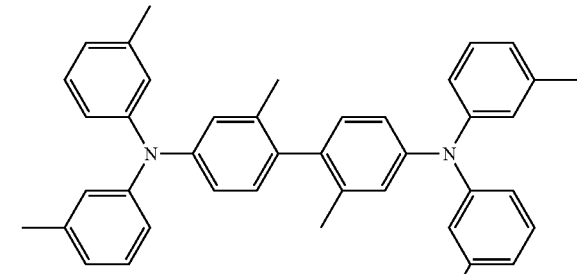
TAPC
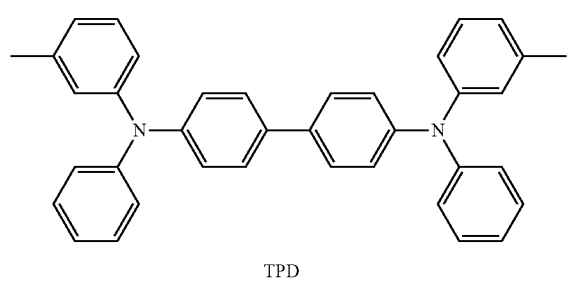
TPD
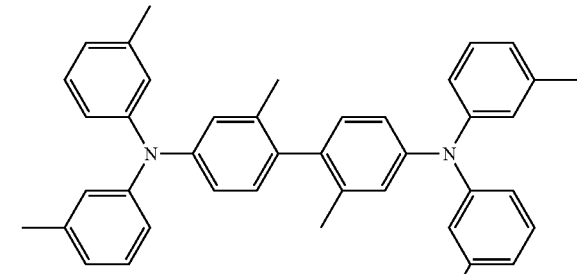
HMTPD Formula 201

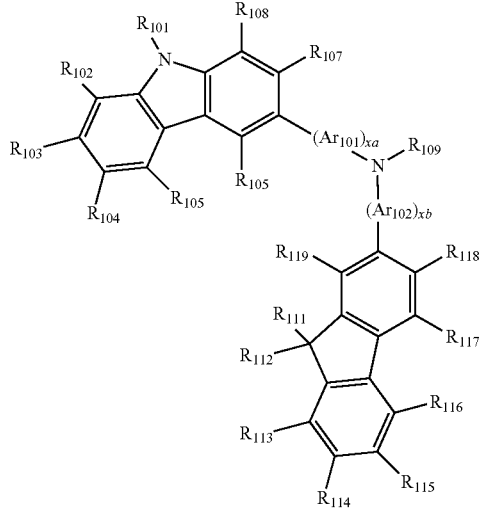

Formula 202

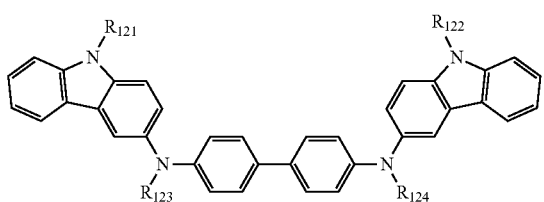

In Formula 201, $Ar_{101}$ and $Ar_{102}$ may be each independently selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group, and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may be each independently an integer from 0 to 5, for example, may be 0, 1, or 2. For example, xa may be 1, and xb may be 0, but are not limited thereto.

In Formulae 201 and 202, $R_{101}$ to $R_{108}$, $R_{111}$ to $R_{119}$, and $R_{121}$ to $R_{124}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, or the like), and a $C_1$-$C_{10}$ alkoxy group (for example, a methoxy group, an ethoxy group, a propoxy group, a butoxy group, a pentoxy group, or the like), a $C_1$-$C_{10}$ alkyl group and a $C_1$-$C_{10}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, an anthracenyl group, a fluorenyl group, and a pyrenyl group, and a phenyl group, a naphthyl group, an anthracenyl group, a fluorenyl group, and a pyrenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group. However, embodiments of the present disclosure are not limited thereto.

In Formula 201 above, $R_{109}$ may be selected from a phenyl group, a naphthyl group, an anthracenyl group, and a pyridinyl group, or a phenyl group, a naphthyl group, an anthracenyl group, and a pyridinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound of Formula 201 may be a compound represented by Formula 201A, but is not limited thereto.

Formula 201A

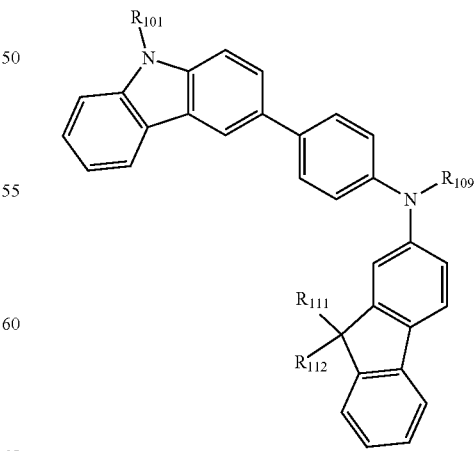

In Formula 201A, $R_{101}$, $R_{111}$, $R_{112}$, and $R_{109}$ may be defined the same as described above.

For example, the compound of Formula 201 and the compound of Formula 202 may be Compounds HT1 to HT20, but are not limited thereto.
HT1
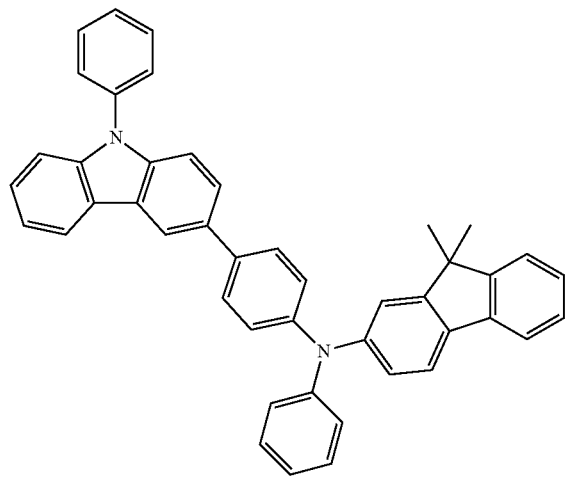
HT2
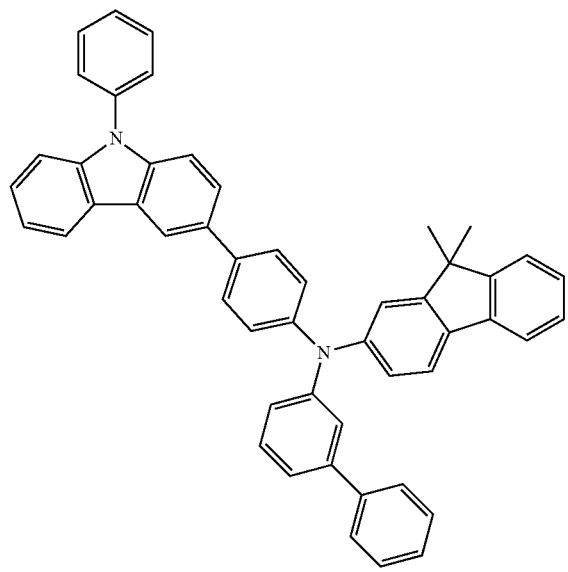
HT3
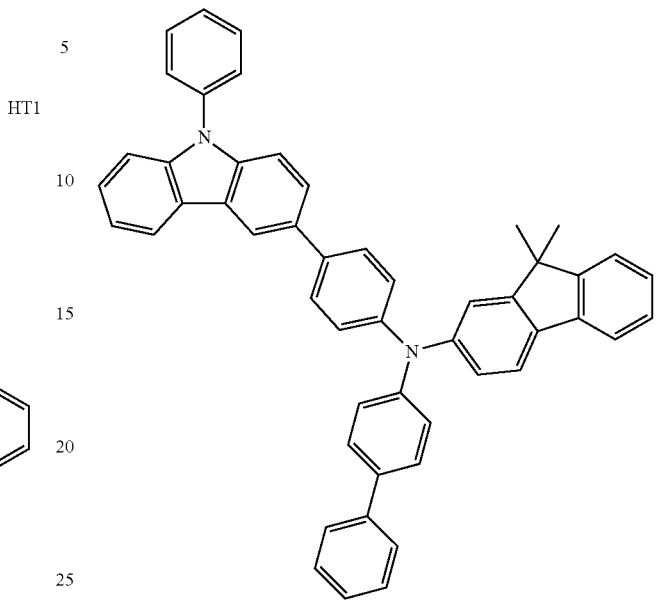
HT4
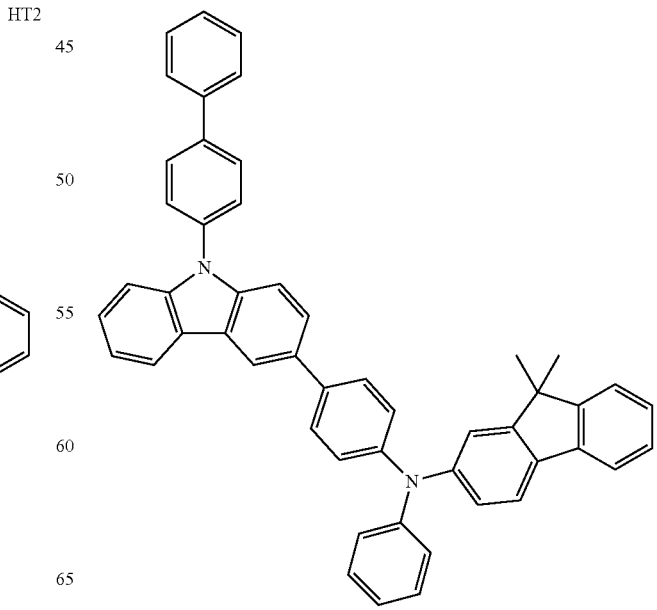

HT5
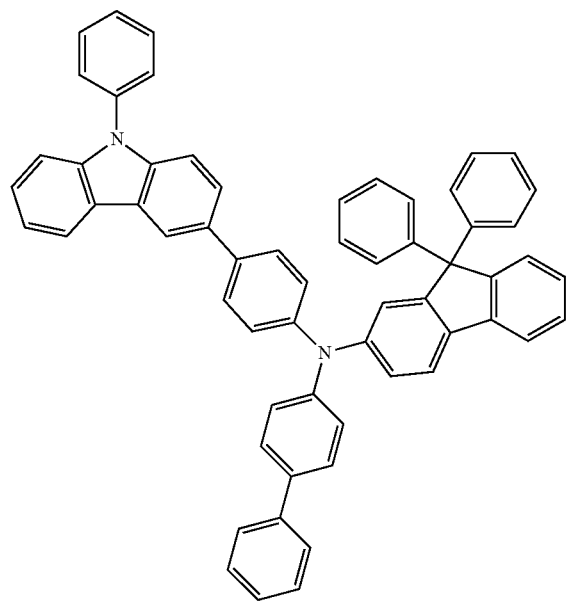
HT6
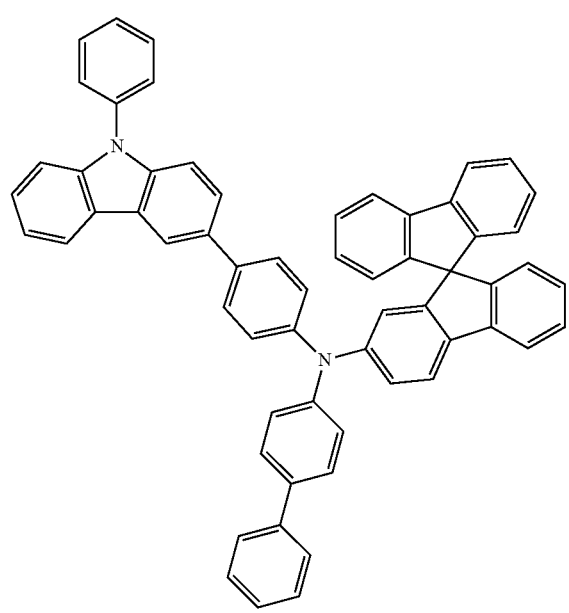
HT7
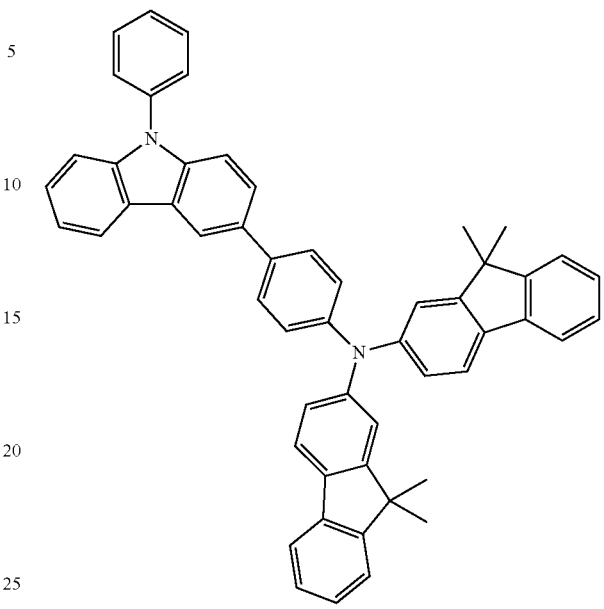
HT8
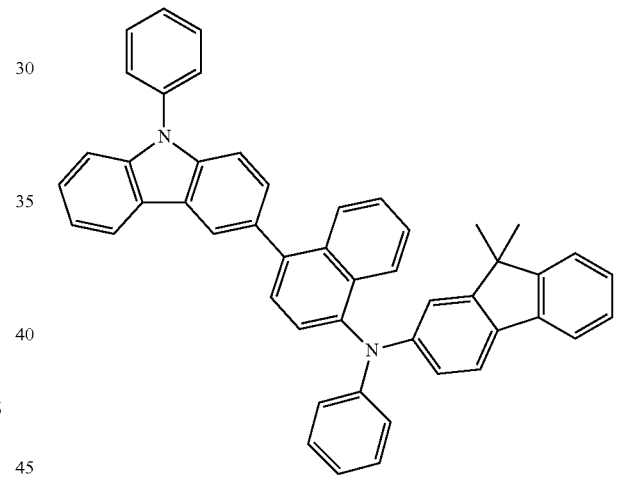
HT9
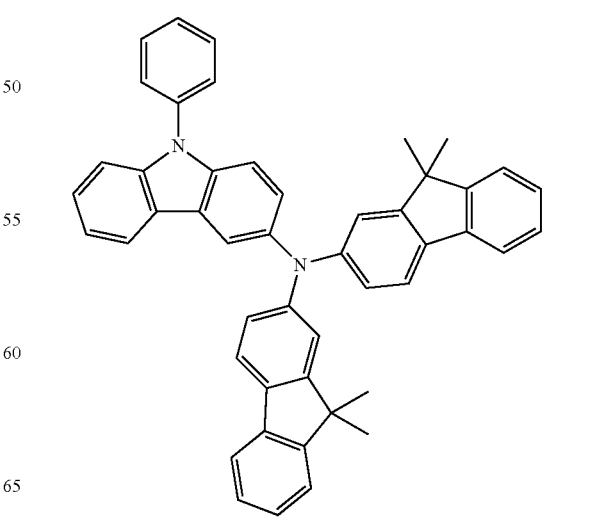

-continued
HT10
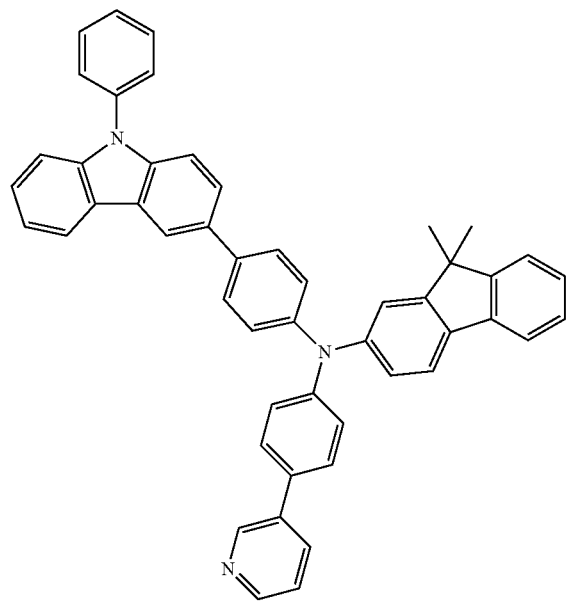
HT11
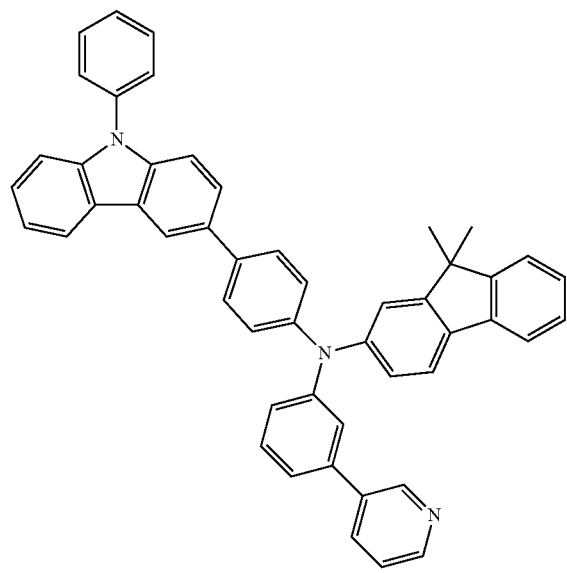
HT12
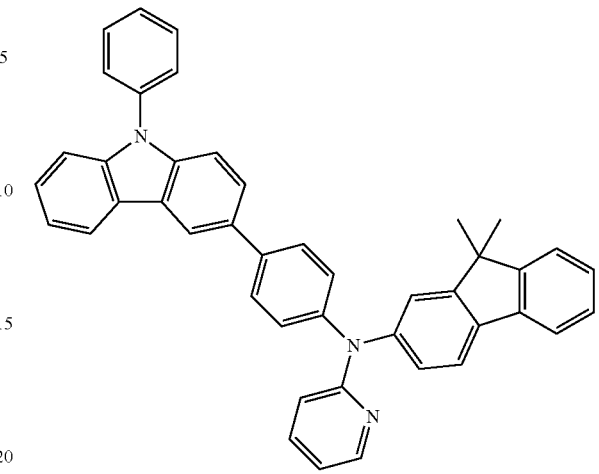
HT13
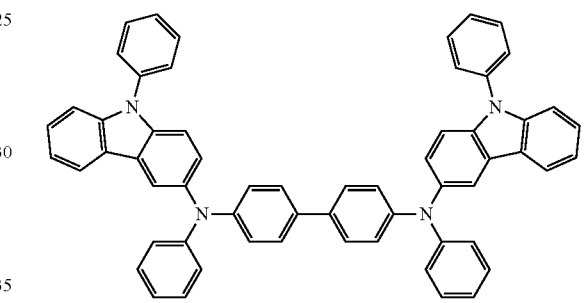
HT14
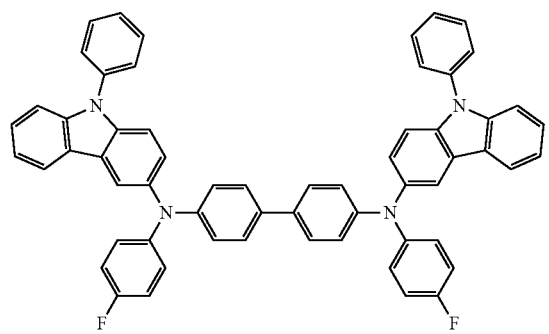
HT15

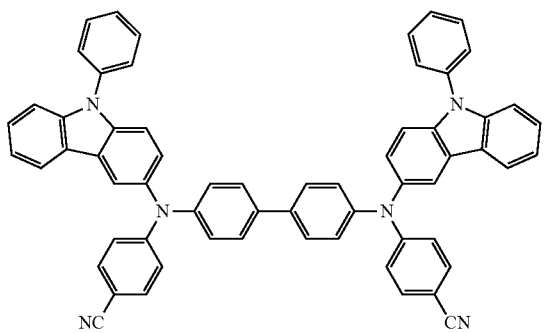
HT16

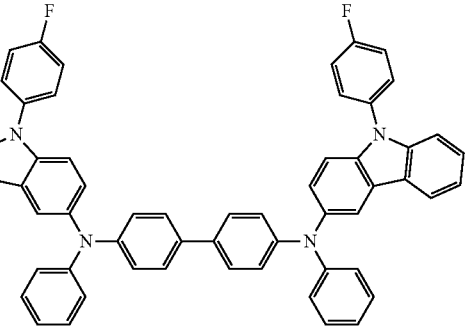
HT20

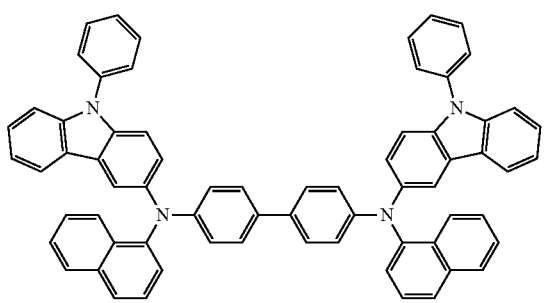
HT17

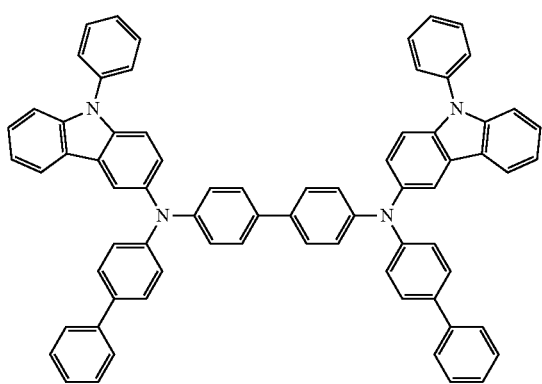
HT18

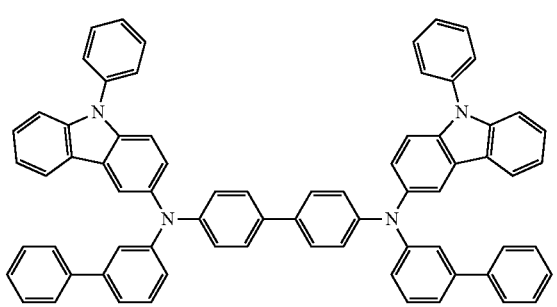
HT19

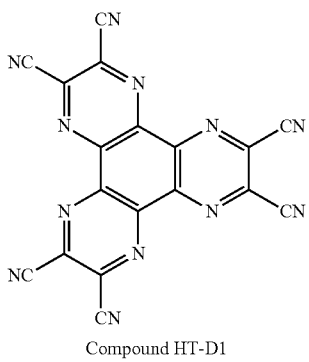
Compound HT-D1

The thickness of the hole transport region may be from about 100 Angstroms (Å) to about 10,000 Å, and in some embodiments, from about 100 Å to about 1,000 Å. When the hole transport region includes a HIL and a HTL, a thickness of the HIL may be from about 100 Å to about 10,000 Å, and in some embodiments, from about 100 Å to about 1,000 Å, and the thickness of the HTL may be from about 50 Å to about 2,000 Å, and in some embodiments, from about 100 Å to about 1,500 Å. While not wishing to be bound by theory, it is understood that when the thicknesses of the hole transport region, the HIL, and the HTL are within these ranges, satisfactory hole transport characteristics may be obtained without a substantial increase in driving voltage.

The hole transport region may further include a charge-generating material to improve conductivity, in addition to the materials described above. The charge-generating material may be homogeneously or non-homogeneously dispersed in the hole transport region.

The charge-generating material may be, for example, a p-dopant. The p-dopant may be one of a quinine derivative, a metal oxide, and a cyano group-containing compound, but is not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound HT-D1 and the like.

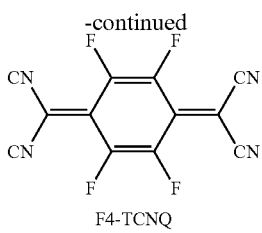

F4-TCNQ

The hole transport region may further include a buffer layer.

The buffer layer may compensate for an optical resonance distance of light according to a wavelength of the light emitted from the EML, and thus may increase efficiency of the OLED.

The EML may be formed on the hole transport region by using vacuum deposition, spin coating, casting, LB deposition, or the like. When the EML is formed using vacuum deposition or spin coating, the conditions for deposition and coating may be similar to those for the formation of the HIL, though the conditions for the deposition and coating may vary depending on the material that is used to form the EML.

When the hole transport region includes an electron blocking layer (EBL), a material for the EBL may be selected from the materials listed above as available for the hole transport region and host materials that will be described later, but are not limited thereto. For example, when the hole transport region includes an EBL, the material for the EBL may be mCP.

The EML may include a host and a dopant. The dopant may include an organometallic compound represented by Formula 1. The host may include at least one of TPBi, TBADN, AND (referred to also as "DNA"), CBP, CDBP, TCP, Mcp, Compound H50, and Compound H51.

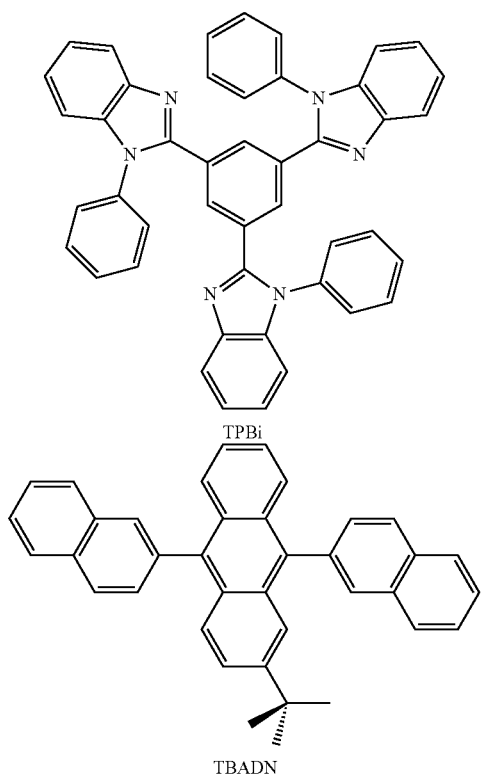

TPBi

TBADN

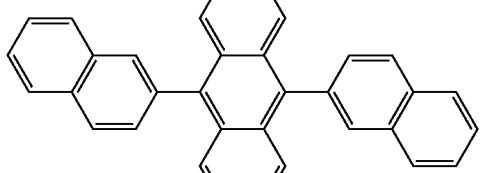

ADN

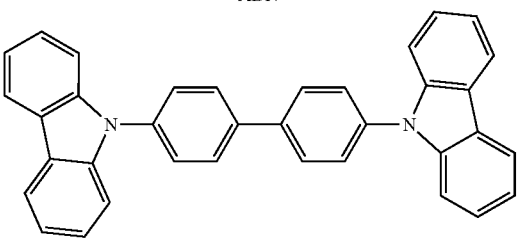

CBP

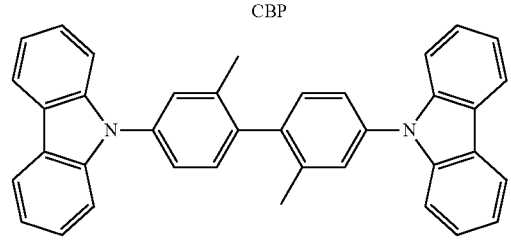

CDBP

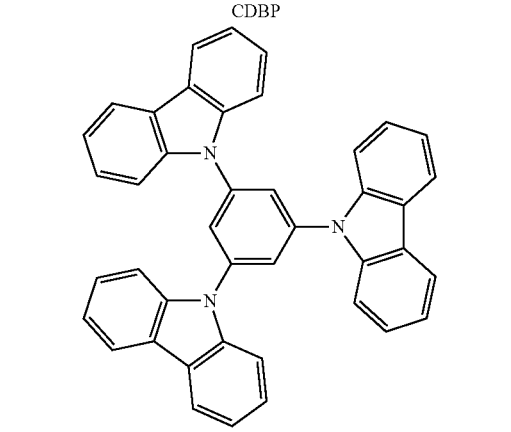

TCP mCP

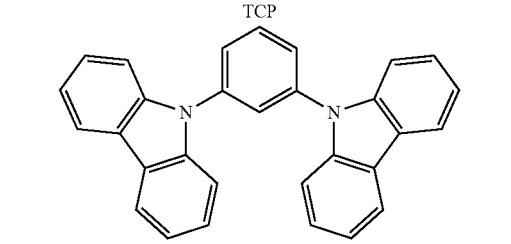

Compound H50

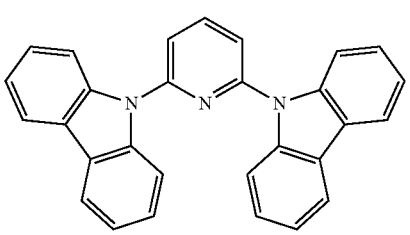

Compound H51

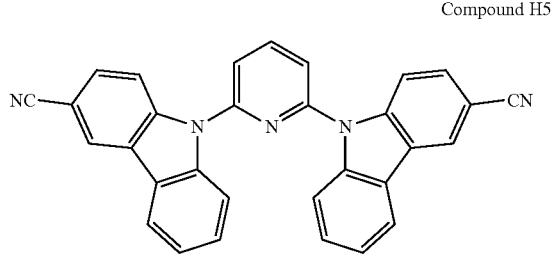

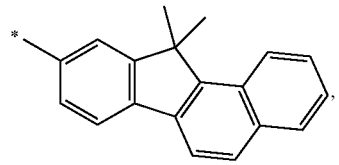 [SMILES: Cc1ccc2c(c1)C(C)(C)c1c-2ccc2ccccc12]

but are not limited thereto.

In some embodiments, the host may include a compound represented by Formula 302.

In some embodiments, the host may further include a compound represented by Formula 301.

Formula 301

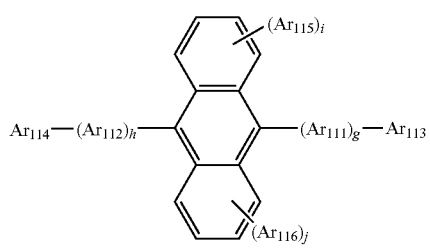

Formula 302

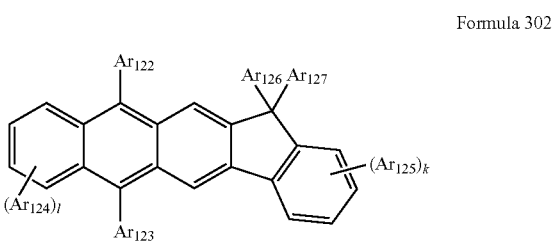

In Formula 301, $Ar_{111}$ and $Ar_{112}$ may be each independently selected from a phenylene group, a naphthylene group, a phenanthrenylene group, and a pyrenylene group, and a phenylene group, a naphthylene group, a phenanthrenylene group, and a pyrenylene group, each substituted with at least one of a phenyl group, a naphthyl group, and an anthracenyl group.

In Formula 301, $Ar_{113}$ to $Ar_{116}$ may be each independently selected from a $C_1$-$C_{10}$ alkyl group, a phenyl group, a naphthyl group, a phenanthrenyl group, and a pyrenyl group, and a phenyl group, a naphthyl group, a phenanthrenyl group, and a pyrenyl group, each substituted with at least one of a phenyl group, a naphthyl group, and an anthracenyl group.

In Formula 301, g, h, 1, and j may be each independently an integer of 0 to 4, for example, 0, 1, or 2.

For example, in Formula 301, $Ar_{113}$ to $Ar_{116}$ may be each independently selected from a $C_1$-$C_{10}$ alkyl group substituted with at least one of a phenyl group, a naphthyl group, and an anthracenyl group, a phenyl group, a naphthyl group, an anthracenyl group, a pyrenyl group, a phenanthrenyl group, and a fluorenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group, and In Formula 302, $Ar_{122}$ to $Ar_{125}$ may be defined the same as $Ar_{113}$ in Formula 301.

In Formula 302, $Ar_{126}$ and $Ar_{127}$ may be each independently a $C_1$-$C_{10}$ alkyl group (for example, a methyl group, an ethyl group, or a propyl group).

In Formula 302, k and l may be each independently an integer of 0 to 4. For example, k and l may be each independently 0, 1, or 2.

The compound of Formula 301 and the compound of Formula 302 may include compounds H1 to H42, but are not limited thereto.

H1

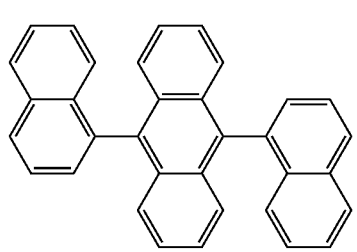

H2

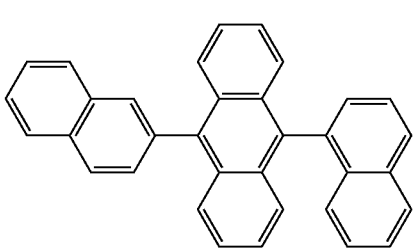

H3

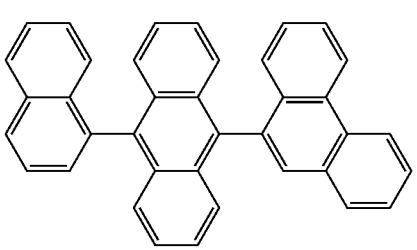

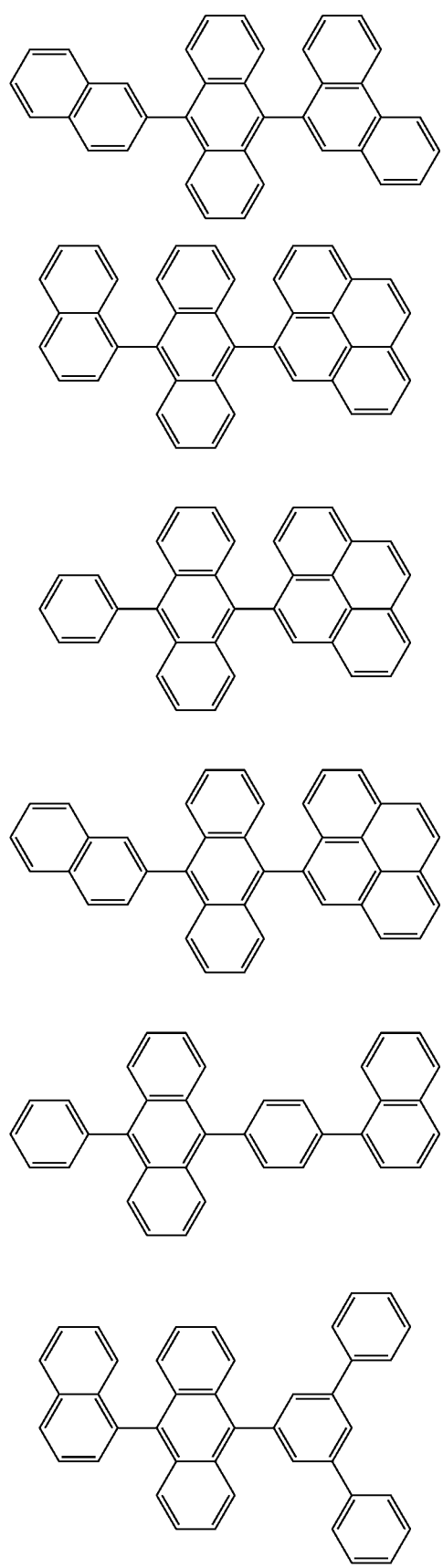
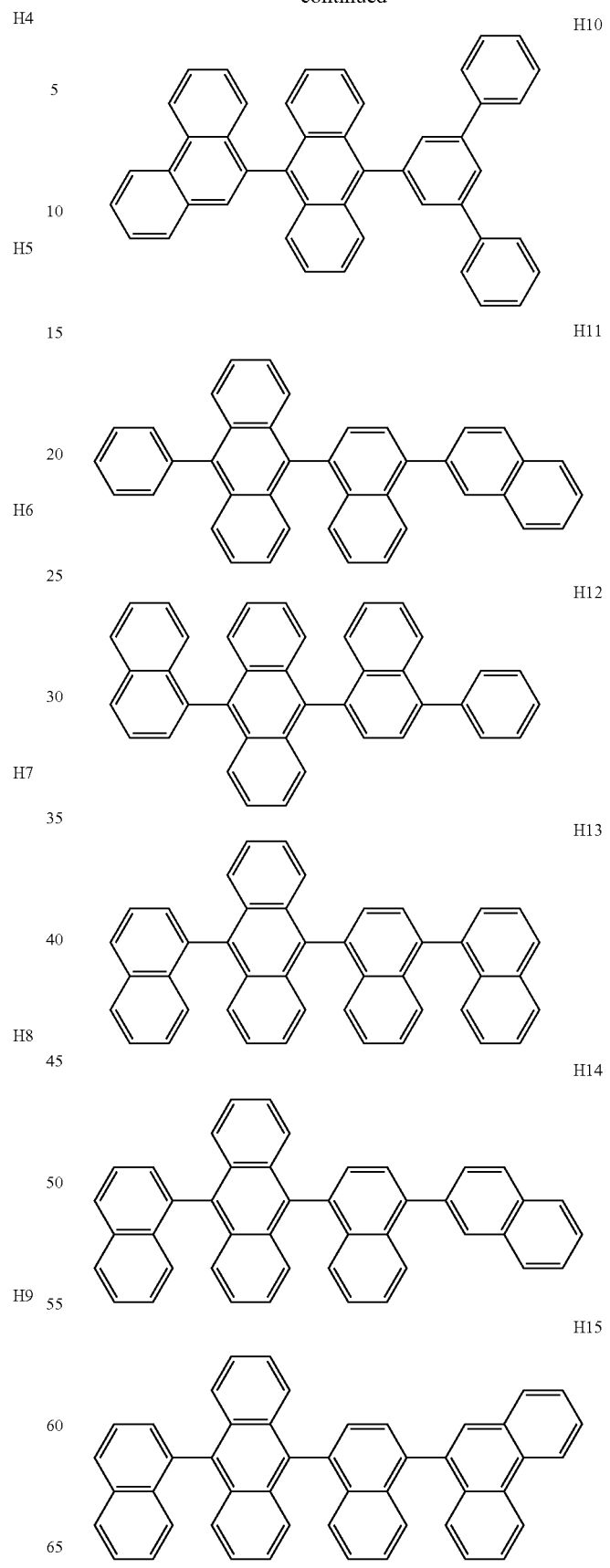

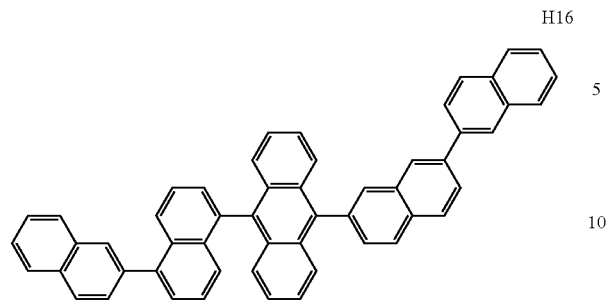
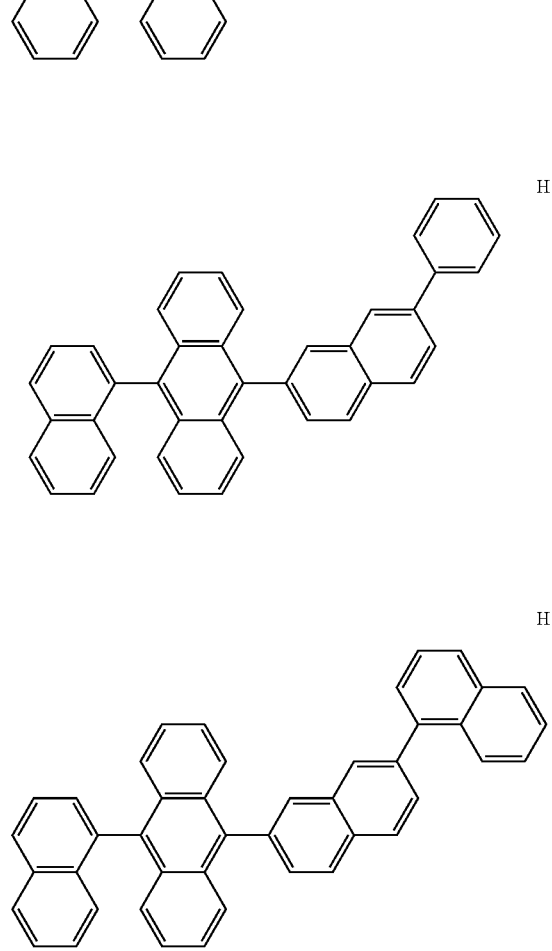
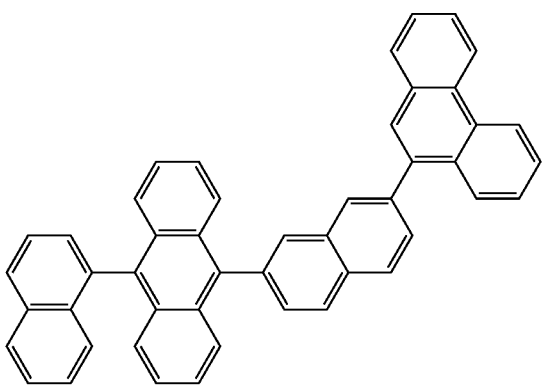

H25
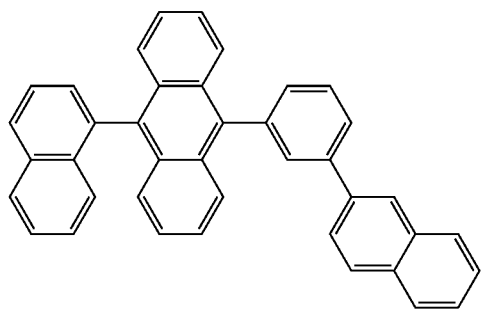
H26
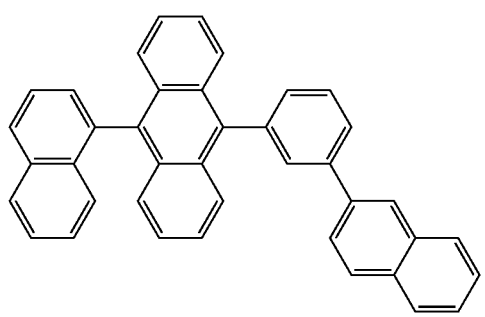
H27
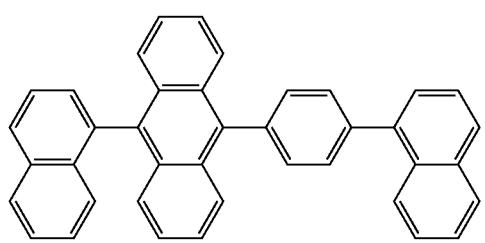
H28
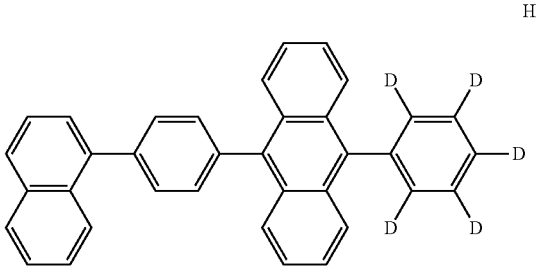
H29
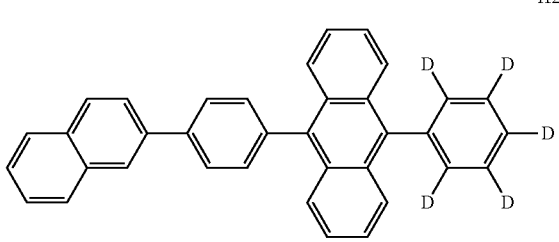
H30
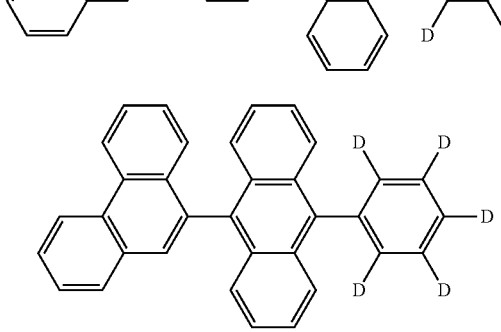
H31
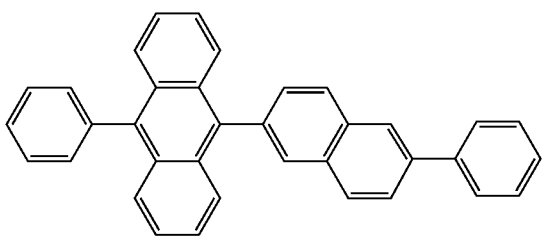
H32
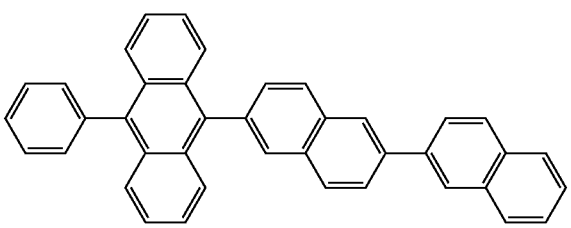
H33
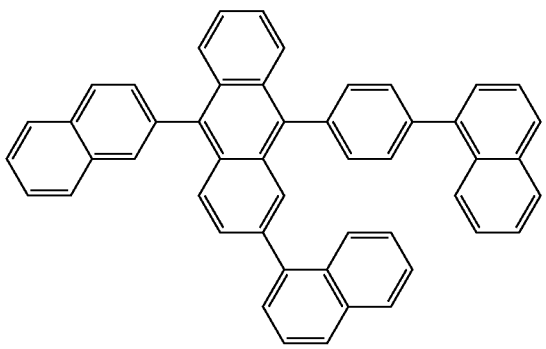
H34
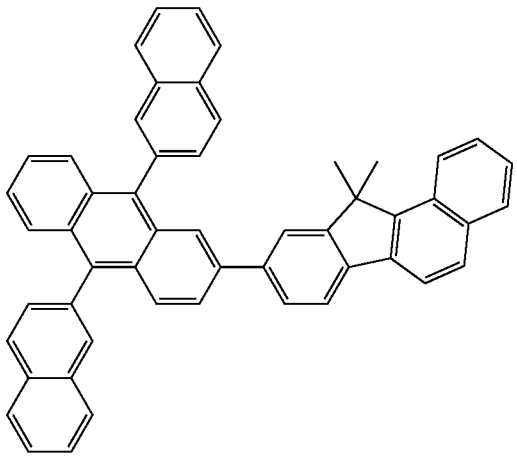

H35
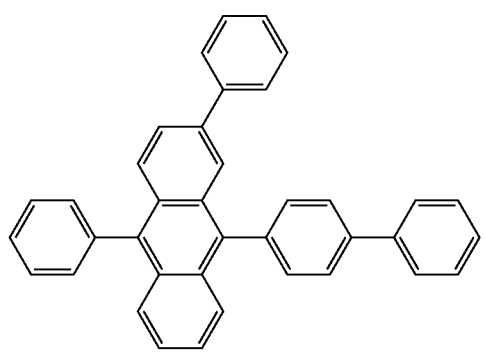
H36
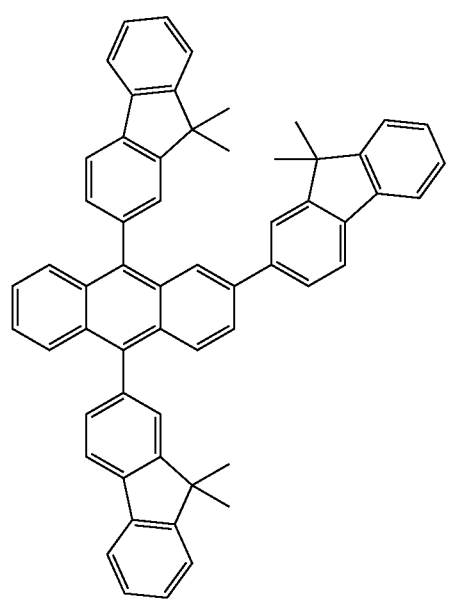
H37
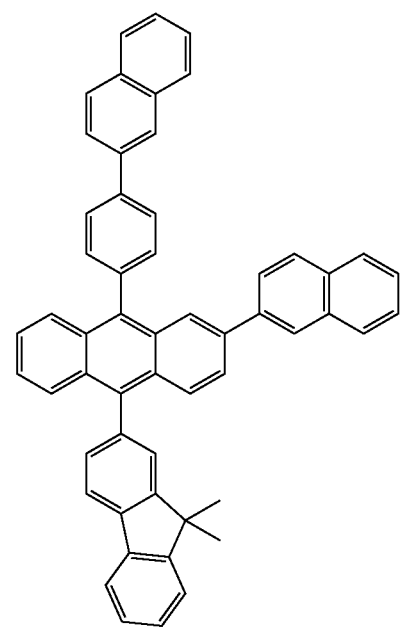
H38
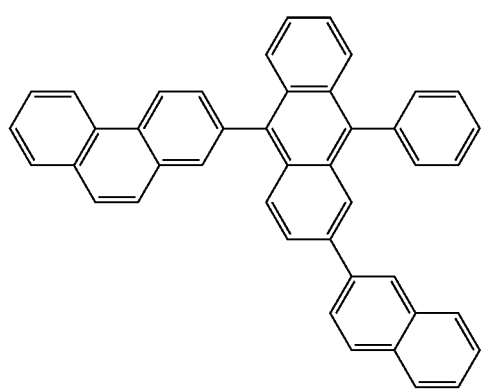
H39
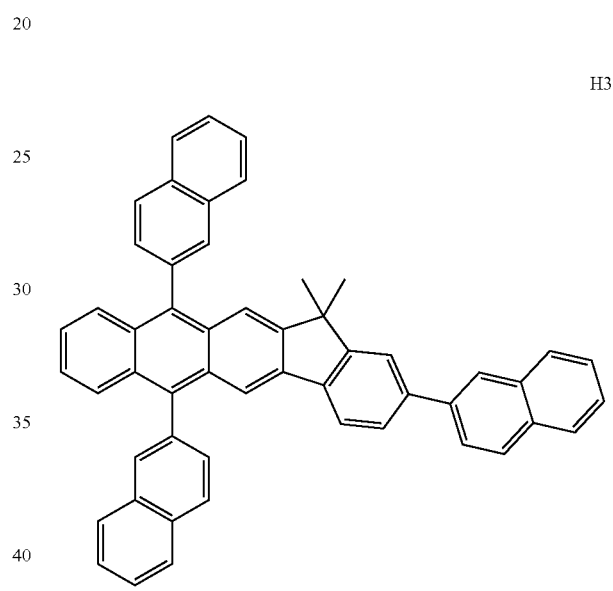
H40
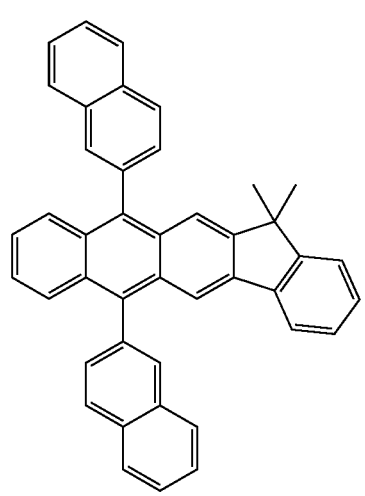

-continued

H41

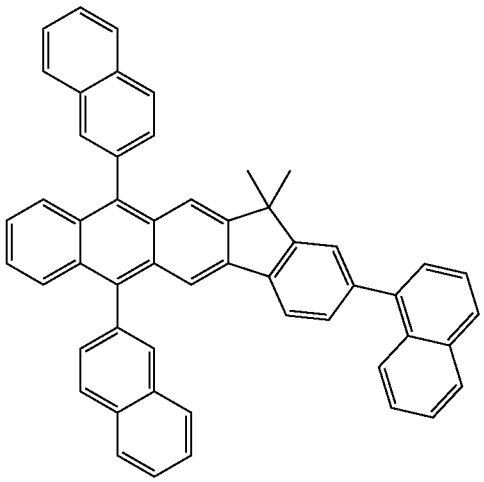

H42

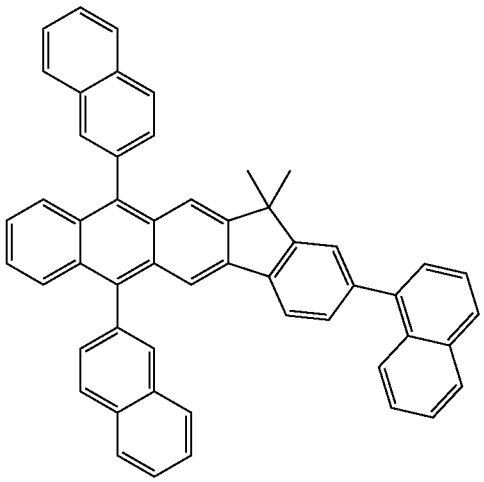

When the organic light-emitting device is a full color organic light-emitting device, the emission layer may be patterned into a red emission layer, a green emission layer, and a blue emission layer. In some embodiments, the EML may have a stack structure including a red emission layer, a green emission layer, and/or a blue emission layer that are stacked upon one another to emit white light, but is not limited thereto.

When the EML includes both a host and a dopant, the amount of the dopant may be from about 0.01 to about 15 parts by weight based on 100 parts by weight of the host. However, the amount of the dopant is not limited to this range.

The thickness of the EML may be about 100 Å to about 1,000 Å, and in some embodiments, may be from about 200 Å to about 600 Å. While not wishing to be bound by theory, it is understood that when the thickness of the EML is within these ranges, the EML may have improved light-emitting ability without a substantial increase in driving voltage.

Next, the electron transport region may be formed on the EML.

The electron transport region may include at least one of a HBL, an ETL, and an EIL.

In some embodiments, the electron transport region may have a structure including a HBL/ETL/EIL, or an ETL/EIL, wherein the layers forming the structure of the electron transport region may be sequentially stacked on the EML in the stated order. However, embodiments of the present disclosure are not limited thereto. The ETL may have a single-layer structure or a multi-layer structure including at least two different materials.

Conditions for forming the HBL, ETL, and EIL of the electron transport region may be the same as those for the HIL described above.

When the electron transport region includes a HBL, the HBL may include at least one of BCP, Bphen, and Balq. However, embodiments of the present disclosure are not limited thereto.

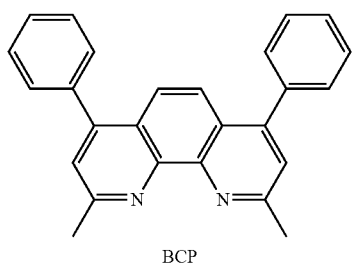

BCP

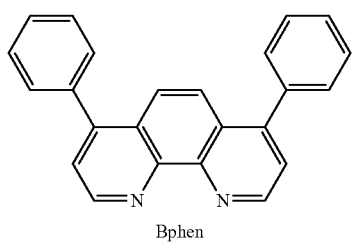

Bphen

The thickness of the HBL may be from about 20 Å to about 1,000 Å, and in some embodiments, from about 30 Å to about 300 Å. While not wishing to be bound by theory, it is understood that when the thickness of the HBL is within these ranges, the HBL may have improved hole blocking ability without a substantial increase in driving voltage.

The ETL may further include at least one of Alq$_3$, Balq, TAZ, and NTAZ, in addition to BCP and Bphen described above.

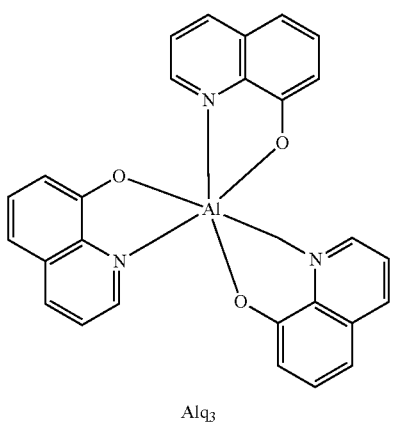

Alq$_3$

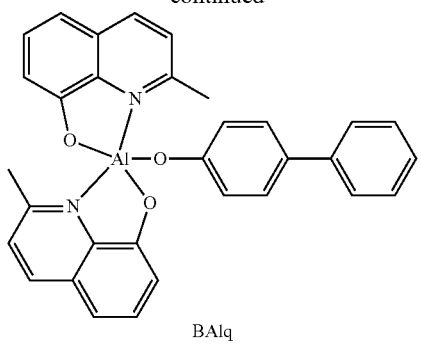

BAlq

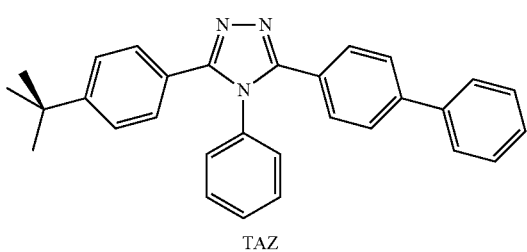

TAZ

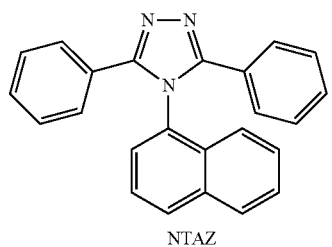

NTAZ

In some embodiments, the ETL may include at least one of Compounds ET1 and ET2, but is not limited thereto.

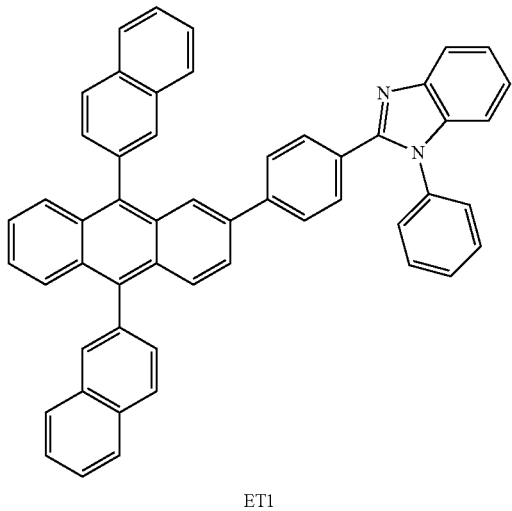

ET1

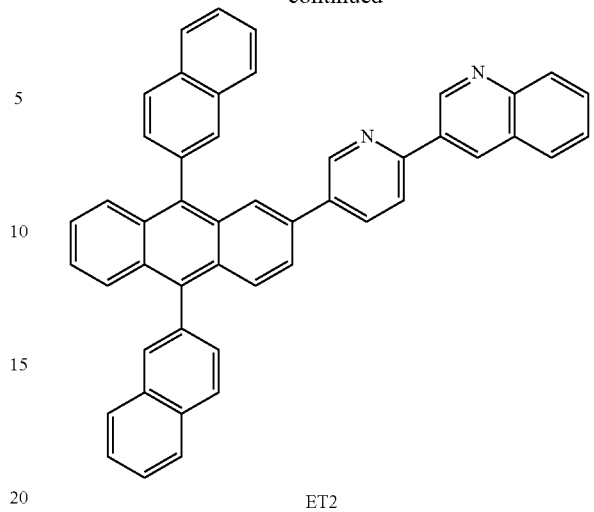

ET2

The thickness of the ETL may be from about 100 Å to about 1,000 Å, and in some embodiments, from about 150 Å to about 500 Å. While not wishing to be bound by theory, it is understood that when the thickness of the ETL is within these ranges, the ETL may have satisfactory electron transporting ability without a substantial increase in driving voltage.

In some embodiments the ETL may further include a metal-containing material, in addition to the above-described materials.

The metal-containing material may include a lithium (Li) complex. Non-limiting examples of the Li complex are compound ET-D1 (lithium quinolate (LiQ)), or compound ET-D2.

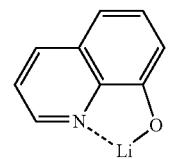

ET-D1

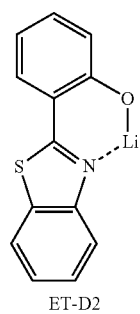

ET-D2

The electron transport region may include an EIL that may facilitate injection of electrons from the second electrode 19. The EIL may include at least one selected from LiF, NaCl, CsF, $Li_2O$, and BaO. The thickness of the EIL may be from about 1 Å to about 100 Å, and in some embodiments, from about 3 Å to about 90 Å. While not wishing to be bound by theory, it is understood that when the thickness of the EIL is within these ranges, the EIL may have satisfactory electron injection ability without a substantial increase in driving voltage.

The second electrode 19 may be disposed on the organic layer 15. The second electrode 19 may be a cathode. A material for the second electrode 19 may be a metal, an alloy, or an electrically conductive compound that has a low work function, or a combination thereof. Non-limiting examples of the material for the second electrode 19 are lithium (Li), magnesium (Mg), aluminum (Al), aluminum (AD-lithium (Li), calcium (Ca), magnesium (Mg)-indium (In), magnesium (Mg)-silver (Ag), or the like. In some embodiments, to manufacture a top-emission light-emitting device, the second electrode 19 may be formed as a transmissive electrode from, for example, indium tin oxide (ITO) or indium zinc oxide (IZO).

Although the organic light-emitting device 10 of FIG. 1 is described above, embodiments of the present disclosure are not limited thereto.

As used herein, a $C_1$-$C_{60}$ alkyl group refers to a linear or branched aliphatic saturated hydrocarbon monovalent group having 1 to 60 carbon atoms. Non-limiting examples of the $C_1$-$C_{60}$ alkyl group are a methyl group, an ethyl group, a propyl group, an iso-butyl group, a sec-butyl group, a tert-butyl group, a pentyl group, an iso-amyl group, and a hexyl group. As used herein, a $C_1$-$C_{60}$ alkylene group refers to a divalent group having the same structure as the $C_1$-$C_{60}$ alkyl group.

As used herein, a $C_1$-$C_{60}$ alkoxy group refers to a monovalent group represented by —$OA_{101}$ (wherein $A_{101}$ is a $C_1$-$C_{60}$ alkyl group, as described above). Non-limiting examples of the $C_1$-$C_{60}$ alkoxy group are a methoxy group, an ethoxy group, and an iso-propyloxy (iso-propoxy) group.

As used herein, a $C_2$-$C_{60}$ alkenyl group has a structure including at least one carbon-carbon double bond in the middle or at the terminal of the $C_2$-$C_{60}$ alkyl group. Non-limiting examples of the $C_2$-$C_{60}$ alkenyl group are an ethenyl group, a propenyl group, and a butenyl group. As used herein, a $C_2$-$C_{60}$ alkylene group refers to a divalent group having the same structure as the $C_2$-$C_{60}$ alkenyl group.

As used herein, a $C_2$-$C_{60}$ alkynyl group has a structure including at least one carbon-carbon triple bond in the middle or terminal of the $C_2$-$C_{60}$ alkyl group. Non-limiting examples of the $C_2$-$C_{60}$ alkynyl group are an ethynyl group and a propynyl group. As used herein, a $C_2$-$C_{60}$ alkynylene group refers to a divalent group having the same structure as the $C_2$-$C_{60}$ alkynyl group.

As used herein, a $C_3$-$C_{10}$ cycloalkyl group refers to a monovalent, monocyclic saturated hydrocarbon group having 3 to 10 carbon atoms. Non-limiting examples of the $C_3$-$C_{10}$ cycloalkyl group are a cyclopropyl group, a cyclobutyl group, a cyclopentyl group, a cyclohexyl group, and a cycloheptyl group. As used herein, a $C_3$-$C_{10}$ cycloalkylene group refers to a divalent group having the same structure as the $C_3$-$C_{10}$ cycloalkyl group.

As used herein, a $C_1$-$C_{10}$ heterocycloalkyl group refers to a monovalent monocyclic group having 1 to 10 carbon atoms in which at least one hetero atom selected from N, O, P, and S is included as a ring-forming atom. Non-limiting examples of the $C_1$-$C_{10}$ heterocycloalkyl group are a tetrahydrofuranyl group and a tetrahydrothiophenyl group. As used herein, a $C_1$-$C_{10}$ heterocycloalkylene group refers to a divalent group having the same structure as the $C_1$-$C_{10}$ heterocycloalkyl group.

As used herein, a $C_3$-$C_{10}$ cycloalkenyl group refers to a monovalent monocyclic group having 3 to 10 carbon atoms that includes at least one carbon-carbon double bond in the ring but which is not have aromatic. Non-limiting examples of the $C_3$-$C_{10}$ cycloalkenyl group are a cyclopentenyl group, a cyclohexenyl group, and a cycloheptenyl group. As used herein, a $C_3$-$C_{10}$ cycloalkenylene group refers to a divalent group having the same structure as the $C_3$-$C_{10}$ cycloalkenyl group.

As used herein, a $C_1$-$C_{10}$ heterocycloalkenyl group refers to a monovalent monocyclic group having 1 to 10 carbon atoms that includes at least one double bond in the ring, and in which at least one hetero atom selected from N, O, P, and S is included as a ring-forming atom. Non-limiting examples of the $C_1$-$C_{10}$ heterocycloalkenyl group are a 2,3-dihydrofuranyl group and a 2,3-dihydrothiophenyl group. As used herein, a $C_1$-$C_{10}$ heterocycloalkenylene group refers to a divalent group having the same structure as the $C_1$-$C_{10}$ heterocycloalkenyl group.

As used herein, a $C_6$-$C_{60}$ aryl group refers to a monovalent, carbocyclic aromatic group having 6 to 60 carbon atoms, and a $C_6$-$C_{60}$ arylene group refers to a divalent, aromatic carbocyclic group having 6 to 60 carbon atoms. Non-limiting examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group, and the $C_6$-$C_{60}$ arylene group include at least two rings, the rings may be fused to each other.

As used herein, a $C_1$-$C_{60}$ heteroaryl group refers to a monovalent, heterocyclic aromatic group having 1 to 60 carbon atoms in which at least one hetero atom selected from N, O, P, and S is included as a ring-forming atom, and thus further including 2 to 60 carbon atoms. As used herein, a $C_1$-$C_{60}$ heteroarylene group refers to a divalent, aromatic heterocyclic group having 1 to 60 carbon atoms in which at least one hetero atom selected from N, O, P, and S is included as a ring-forming atom. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl and the $C_1$-$C_{60}$ heteroarylene include at least two rings, the rings may be fused to each other.

As used herein, a $C_6$-$C_{60}$ aryloxy group indicates —$OA_{102}$ (wherein $A_{102}$ is a $C_6$-$C_{60}$ aryl group, as described above), and a $C_6$-$C_{60}$ arylthio group indicates —$SA_{103}$ (wherein $A_{103}$ is a $C_6$-$C_{60}$ aryl group, as described above).

As used herein, the monovalent non-aromatic condensed polycyclic group refers to a monovalent group (including, for example, 8 to 60 carbon atoms) that includes at least two rings condensed with each other, that includes only carbon atoms as ring-forming atoms, that is non-aromatic as a whole. An example of the monovalent non-aromatic condensed polycyclic group is a fluorenyl group. As used herein, a divalent non-aromatic condensed polycyclic group refers to a divalent group with the same structure as the monovalent non-aromatic condensed polycyclic group.

As used herein, the monovalent non-aromatic condensed heteropolycyclic group refers to a monovalent group (including, for example, 2 to 60 carbon atoms) that includes at least two rings condensed with each other, that include carbons and hetero atoms selected from N, O, P and S as ring-forming atoms, and that is non-aromatic as a whole. An example of the monovalent non-aromatic condensed heteropolycyclic group is a carbazolyl group. As used herein, a divalent non-aromatic condensed heteropolycyclic group refers to a divalent group with the same structure as the monovalent non-aromatic condensed polycyclic group.

As used herein, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and —C(=O)(Q$_{11}$), —Si(Q$_{11}$)(Q$_{12}$)(Q$_{13}$), and —N(Q$_{11}$)(Q$_{12}$), wherein Q$_{11}$ to Q$_{13}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

One or more embodiments of the present disclosure will now be described in detail with reference to the following synthesis examples and other examples of compounds and organic light-emitting devices. However, these examples are for illustrative purposes only and are not intended to limit the scope of the present disclosure. In the following synthesis examples, the expression that "'B', instead of 'A', was used" means that the amounts of 'B' and 'A' were the same in terms of equivalent.

EXAMPLE

Synthesis Example 1: Synthesis of Compound 2

1) Synthesis of Intermediate 2-A

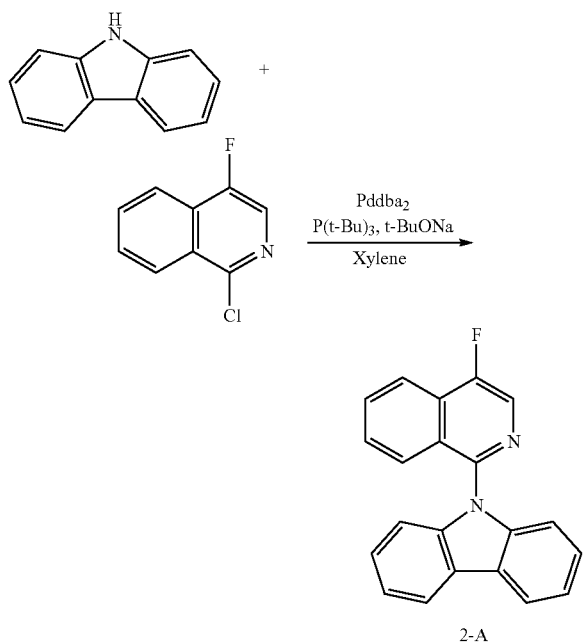

2-A 5.53 grams (g) (33.0 millimoles, mmol) of carbazole (9H-carbazole), 5.00 g (27.5 mmol) of 1-chloro-4-fluoroisoquinoline, 1.58 g (2.75 mmol) of Pd(dba)$_2$, 1.58 g (5.51 mmol) of P(t-Bu)$_3$, and 3.34 g (35.8 mmol) of t-BuONa were mixed with 180 milliliters (mL) of o-xylene and stirred under reflux for about 18 hours. The resulting reaction mixture was cooled down to room temperature, followed by extraction with ethyl acetate to obtain an organic phase. An anhydrous magnesium sulfate (MgSO$_4$) was added to the organic phase to remove moisture therefrom, followed by filtration to obtain a filtrate. The filtrate was evaporated under reduced pressure and purified by column chromatography with ethyl acetate and hexane (1:8) to obtain Intermediate 2-A (3.00 g, Yield: 35%). This intermediate 2-A was identified by mass spectroscopy (MS).

MALDI-TOFMS (m/z): $C_{21}H_{13}FN_2$ (M+H)$^+$ 312.

2) Synthesis of Intermediate 2-B

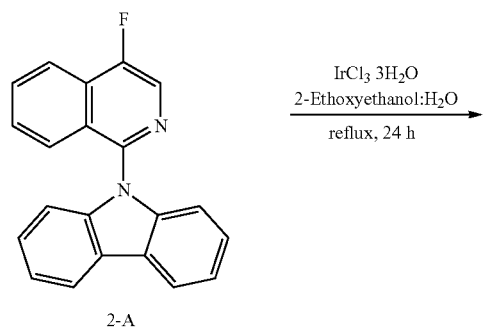

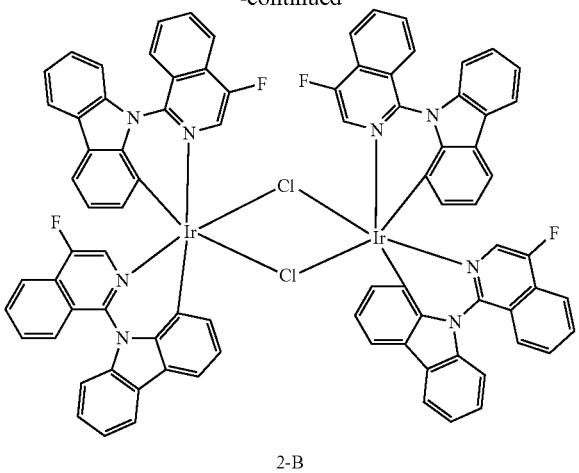

2-B 2.07 g (6.61 mmol) of Intermediate 2-A and 1.04 g (2.94 mmol) of iridium chloride were mixed with 15 mL of ethoxyethanol and 5 mL of distilled water and stirred under reflux for about 24 hours. After completion of the reaction, the temperature was cooled down to room temperature, and the resulting solid was separated by filtration, thoroughly washed with water, methanol, and n-hexane, and dried in a vacuum oven to obtain Compound 2-B (2.0 g, Yield: 80%).

3) Synthesis of Compound 2

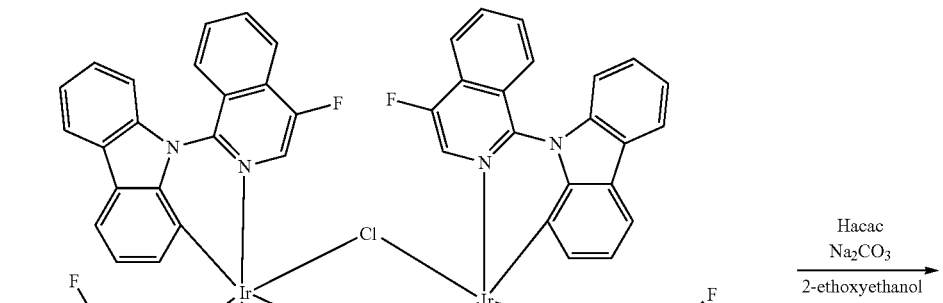

2-B

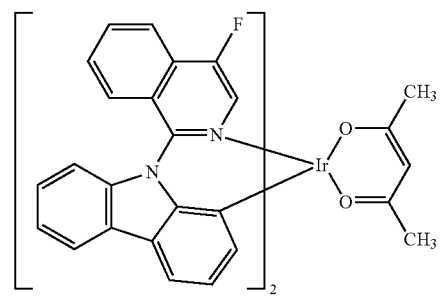

2

2.00 g (1.17 mmol) of Intermediate 2-B, 1.17 g (11.8 mmol) of acetylacetone, and 1.62 g (11.7 mmol) of $K_2CO_3$ were mixed with 15 mL of ethoxyethanol, and stirred for about 24 hours. The resulting reaction mixture was filtered to obtain a solid. This solid was thoroughly washed with ethanol and hexane, and separated by column chromatography with dichloromethane and n-hexane (1:1 volume to volume (v/v)) to obtain Compound 2 (0.43 g, Yield: 20%). This compound 2 was identified by MS and high-performance liquid chromatography (HPLC).

HRMS (MALDI) calcd for $C_{47}H_{31}F_2IrN_4O_2$: m/z 914.2044. Found: 914.2042.

Synthesis Example 2: Synthesis of Compound 3

1) Synthesis of Intermediate 3-A

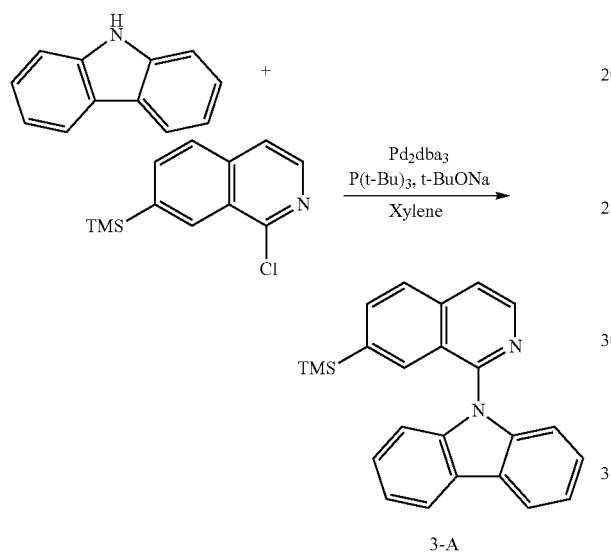

3-A

Intermediate 3-A (2.1 g, Yield: 35%) was obtained in the same manner as in the synthesis of Intermediate 2-A of Synthesis Example 1, except that 4.63 g (19.6 mmol) of 1-chloro-7-(trimethylsilyl)isoquinoline, instead of 1-chloro-4-fluoroisoquinoline, was used. This Intermediate 3-A was identified by MS.

MALDI-TOFMS (m/z): $C_{24}H_{22}N_2Si$ $(M+H)^+$ 366.

2) Synthesis of Intermediate 3-B

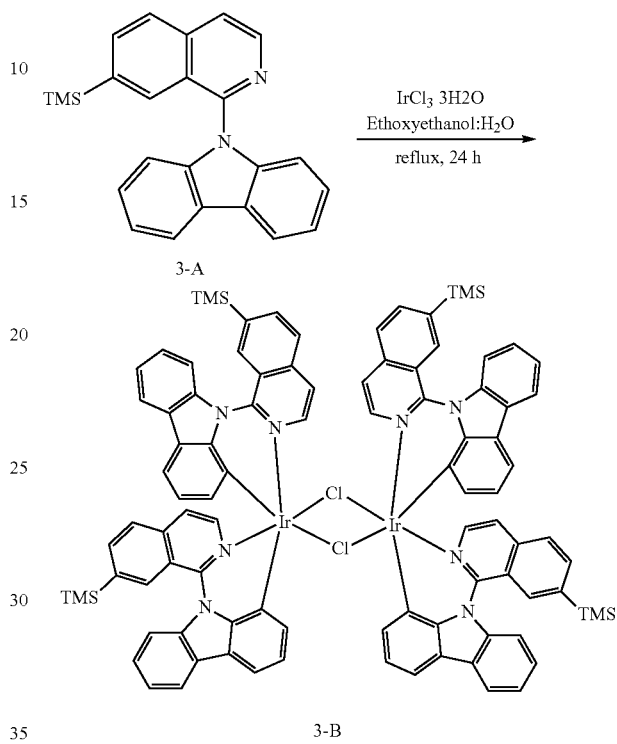

3-B

Intermediate 3-B (1.64 g, Yield: 66%) was obtained in the same manner as in the synthesis of Intermediate 2-B of Synthesis Example 1, except that 2.15 g (5.87 mmol) of Intermediate 3-A, instead of Intermediate 2-A, was used.

3) Synthesis of Compound 3

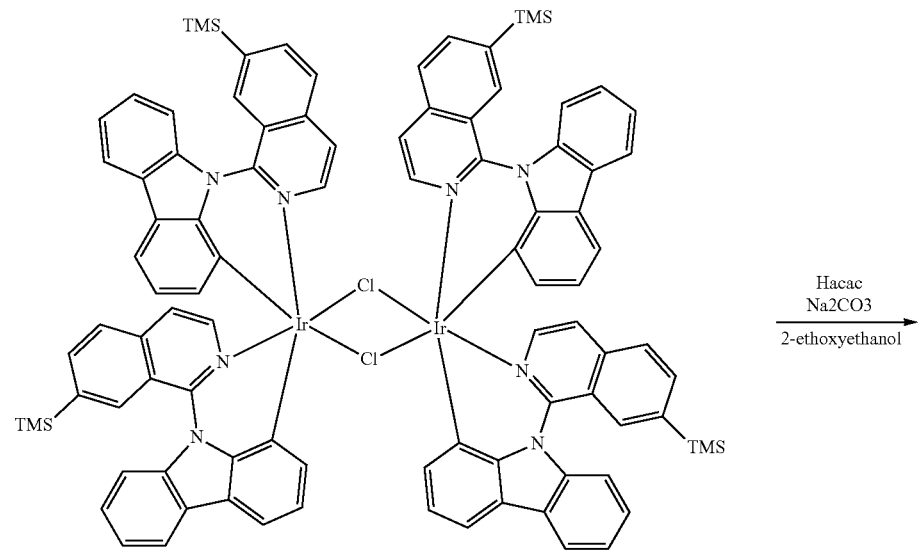

3-B

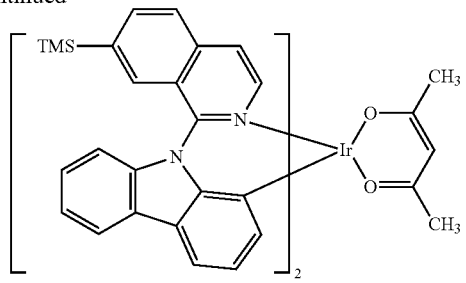

3

Compound 3 (0.20 g, 11%) was obtained in the same manner as in the synthesis of Compound 2 of Synthesis Example 1, except that 1.64 g (0.86 mmol) of Intermediate 3-B, instead of Intermediate 2-B, was used. This compound 3 was identified by MS and HPLC.

HRMS (MALDI) calcd for $C_{53}H_{49}IrN_4O_2Si_2$: m/z 1022.3023. Found: 1022.3023.

Synthesis Example 3: Synthesis of Compound 4

1) Synthesis of Intermediate 4-A

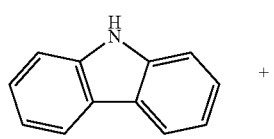
+
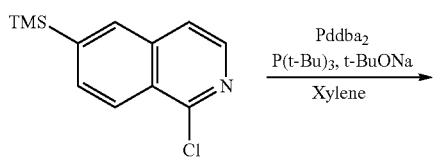

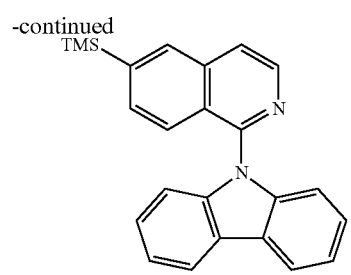

4-A

Intermediate 4-A (2.4 g, Yield: 40%) was obtained in the same manner as in the synthesis of Intermediate 2-A of Synthesis Example 1, except that 4.63 g (19.6 mmol) of 1-chloro-6-(trimethylsilyl)isoquinoline, instead of 1-chloro-4-fluoroisoquinoline, was used. This Intermediate 4-A was identified by MS.

MALDI-TOFMS (m/z): $C_{24}H_{22}N_2Si$ $(M+H)^+$ 366.

2) Synthesis of Compound 4-B

Intermediate 4-A (2.4 g, Yield: 40%) was obtained in the same manner as in the synthesis of Intermediate 2-A of Synthesis Example 1, except that 4.63 g (19.6 mmol) of 1-chloro-6-(trimethylsilyl)isoquinoline, instead of 1-chloro-4-fluoroisoquinoline, was used. This Intermediate 4-A was identified by MS.

MALDI-TOFMS (m/z): $C_{24}H_{22}N_2Si$ $(M+H)^+$ 366.

2) Synthesis of Compound 4-B

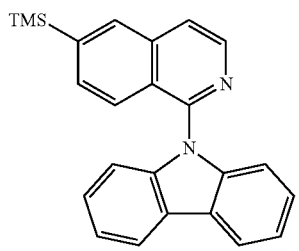

4-A

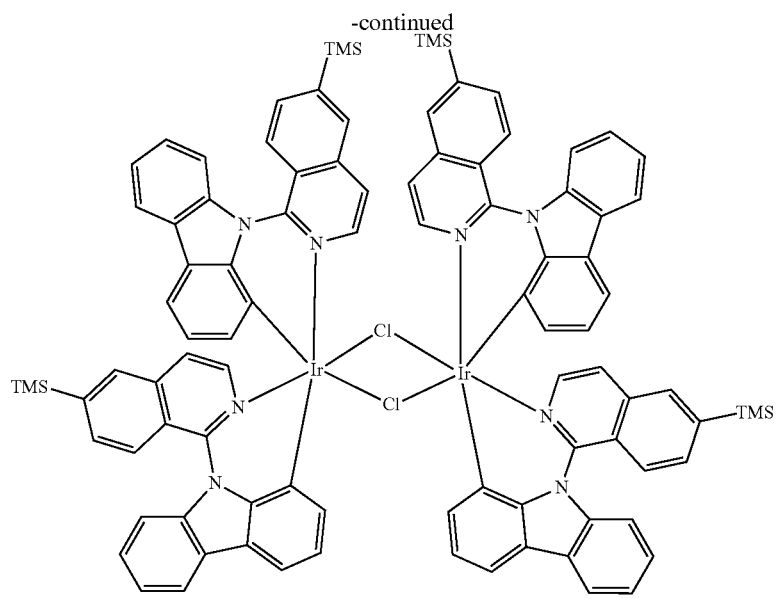
4-B
Intermediate 4-B (1.93 g, Yield: 69%) was obtained in the same manner as in the synthesis of Intermediate 2-B of Synthesis Example 1, except that 2.41 g (6.57 mmol) of Intermediate 4-A, instead of Intermediate 2-A, was used.
3) Synthesis of Compound 4
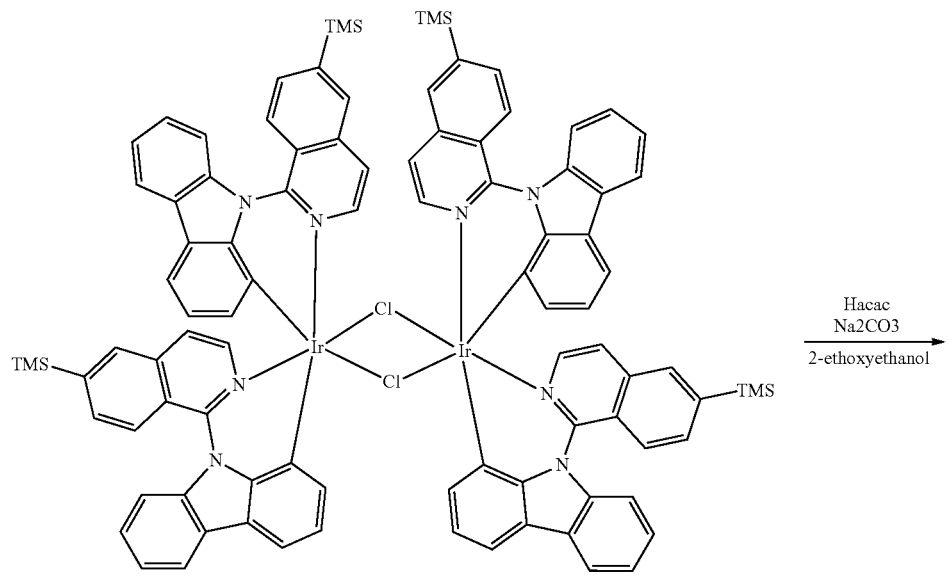
4-B

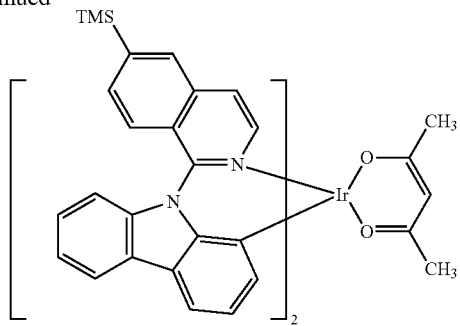

4

Compound 4 (0.26 g, Yield: 13%) was obtained in the same manner as in the synthesis of Compound 2 of Synthesis Example 1, except that 1.93 g (1.00 mmol) of Intermediate 4-B, instead of Intermediate 2-B, was used. This compound 4 was identified by MS and HPLC.

HRMS (MALDI) calcd for $C_{53}H_{49}IrN_4O_2Si_2$: m/z 1022.3023. Found: 1022.3020.

Synthesis Example 4: Synthesis of Compound 9

1) Synthesis of Compound 9-A

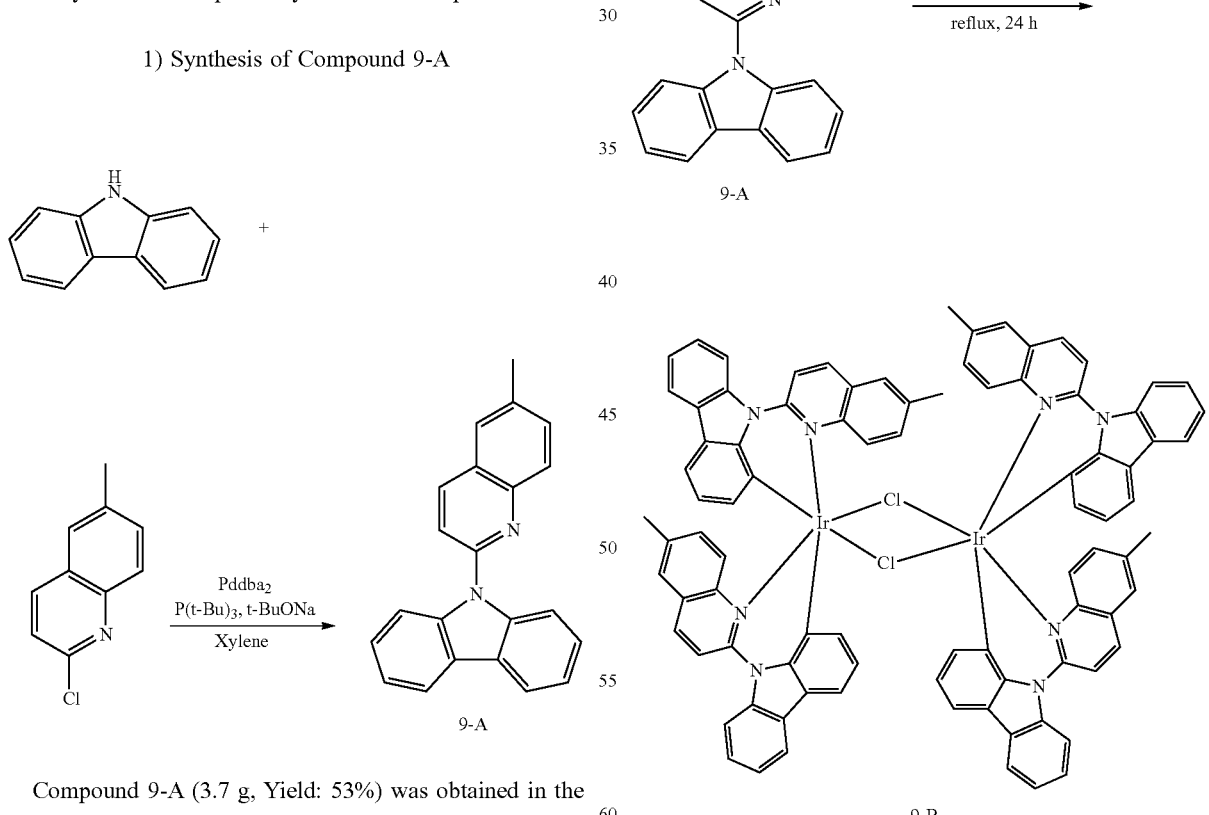

Compound 9-A (3.7 g, Yield: 53%) was obtained in the same manner as in the synthesis of Intermediate 2-A of Synthesis Example 1, except that 4.08 g (27.2 mmol) of 2-chloro-6-methylquinoline, instead of 1-chloro-4-fluoroisoquinoline, was used. This Intermediate 9-A was identified by MS.

MALDI-TOFMS (m/z): $C_{24}H_{16}N_2$ (M+H)$^+$308.

2) Synthesis of Compound 9-B

Intermediate 9-B (3.15 g, Yield: 70%) was obtained in the same manner as in the synthesis of Intermediate 2-B of Synthesis Example 1, except that 3.7 g (12.0 mmol) of Intermediate 9-A, instead of Intermediate 2-A, was used.

3) Synthesis of Compound 9

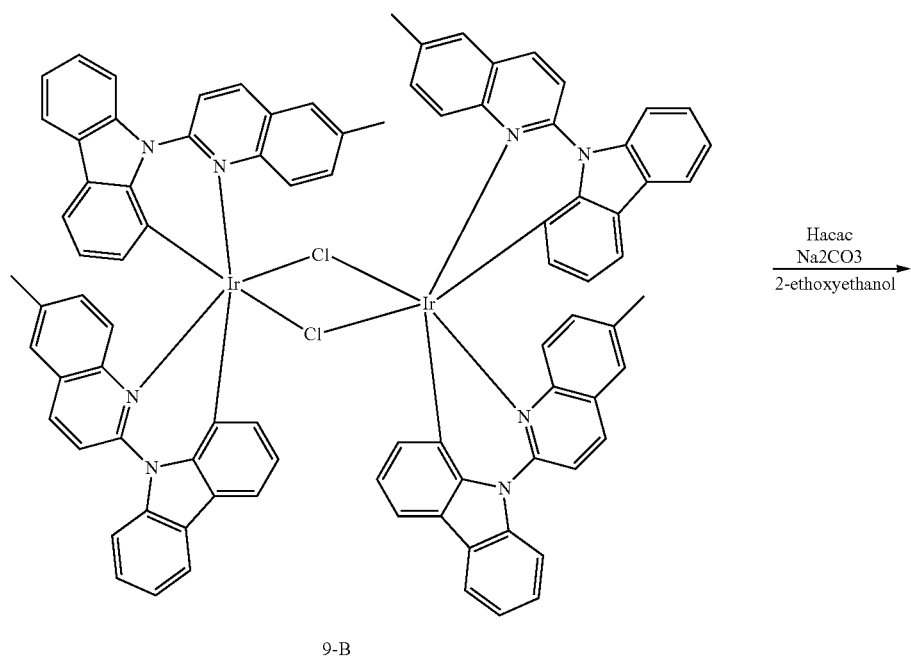

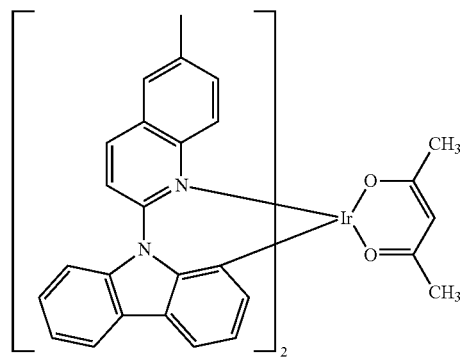

Compound 9 (0.49 g, Yield: 15%) was obtained in the same manner as in the synthesis of Compound 2 of Synthesis Example 1, except that 3.12 g (1.85 mmol) of Intermediate 9-B, instead of Intermediate 2-B, was used. This compound 9 was identified by MS and HPLC.

HRMS (MALDI) calcd for $C_{49}H_{37}IrN_4O_2$: m/z 906.2546. Found: 906.2542.

Comparative Synthesis Example: Synthesis of Compound A

1) Synthesis of Intermediate A-0

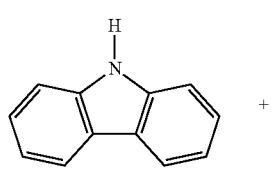

-continued

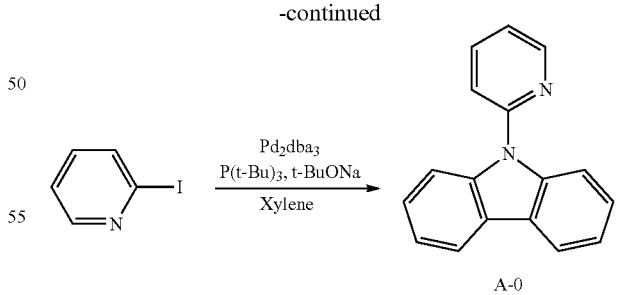

Compound A-0 (4.5 g, Yield: 78%) was obtained in the same manner as in the synthesis of Intermediate 2-A of Synthesis Example 1, except that 7.30 g (35.6 mmol) of 2-iodopyridine, instead of 1-chloro-4-fluoroisoquinoline, was used. This Intermediate A-0 was identified by MS.

MALDI-TOFMS (m/z): $C_{17}H_{12}N_2$ (M+H)$^+$ 244.

2) Synthesis of Intermediate A-1

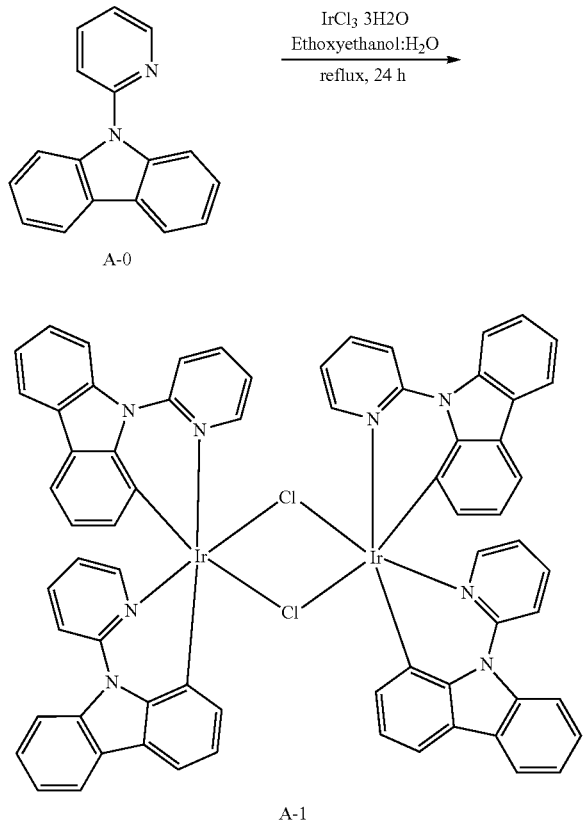

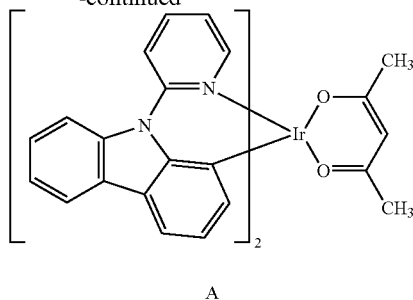

7.70 g (31.50 mmol) of Compound A-0 and 4.94 g (14.00 mmol) of iridium chloride were mixed with 90 mL of ethoxyethanol and 30 mL of distilled water and stirred under reflux for about 24 hours. After completion of the reaction, the temperature was cooled down to room temperature, and the resulting solid was separated by filtration, thoroughly washed with water, methanol, and hexane, and dried in a vacuum oven to obtain Intermediate A-1 (8.6 g, Yield: 86%).

3) Synthesis of Compound A

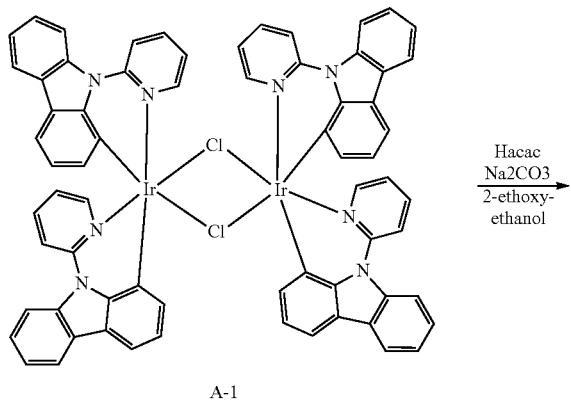

4.13 g (2.89 mmol) of Intermediate A-1, 2.90 g (28.92 mmol) of acetylacetone, and 4.00 g (28.92 mmol) of $K_2CO_3$ were mixed with 50 mL of ethoxyethanol and stirred under reflux for about 12 hours. After completion of the reaction, the temperature was cooled down to room temperature, and the resulting reaction mixture was filtered to obtain a solid. This solid was thoroughly washed with ethanol and hexane, and separated by column chromatography with dichloromethane and n-hexane (1:1 v/v) to obtain Compound A (0.95 g, Yield: 21%). This compound A was identified by MS and HPLC.

HRMS (MALDI) calcd for $C_{39}H_{29}IrN_4O_2$: m/z 778.1920. Found: 778.1914.

Example 1

An ITO glass substrate was cut to a size of about 50 mm×50 mm×0.5 mm (mm=millimeters), and sonicated in acetone, iso-propyl alcohol, and deionized water, for about 5 minutes in each solvent, cleaned by irradiation with ultraviolet rays and exposure to ozone for about 30 minutes. After m-MTDATA was deposited on the ITO electrode (anode) of the ITO glass substrate at a deposition rate of about 1 Angstrom per second (Å/sec) to form a hole injection layer (HIL) having a thickness of about 600 Å, α-NPD was deposited on the HIL at a deposition rate of about 1 Å/sec to form a hole transport layer (HTL) having a thickness of about 250 Å.

Next, Compound 2 (dopant) and CBP (host) were co-deposited on the HTL at a deposition rate of about 0.1 Å/sec and about 1 Å/sec, respectively, to form an emission layer (EML) having a thickness of about 400 Å.

After BAlq was deposited on the EML at a deposition rate of about 1 Å/sec to form a hole blocking layer (HBL) having a thickness of about 50 Å, and then $Alq_3$ was deposited on the HBL to form an electron transport layer (ETL) having a thickness of about 300 Å, LiF was deposited on the ETL to form an electron injection layer (EIL) having a thickness of about 10 Å, and then Al was vacuum-deposited on the EIL to form a second electrode (cathode) having a thickness of about 1,200 Å, thereby manufacturing an organic light-emitting device having a structure of ITO/m-MTDATA (600 Å)/α-NPD (250 Å)/CBP+10 Vol. % (Compound 2) (400 Å)/Balq (50 Å) /$Alq_3$ (300 Å)/LiF (10 Å)/Al (1,200 Å).

Example 2

An organic light-emitting device was manufactured in the same manner as in Example 1, except that Compound 3, instead of Compound 2, was used to form the EML.

Comparative Example 1

An organic light-emitting device was manufactured in the same manner as in Example 1, except that Compound A, instead of Compound 2, was used to form the EML.

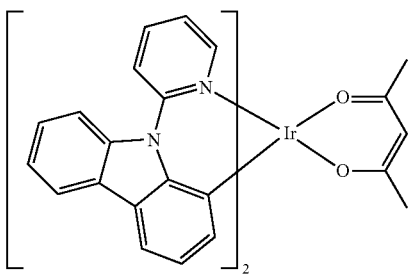

Evaluation Example 1: Characteristic Evaluation of Organic Light-Emitting Device Driving voltage, current efficiency, electroluminescent (EL) wavelength ($\lambda_{max}$), and lifetime characteristics of the organic light-emitting devices of Examples 1 to 2 and Comparative Example 1 were evaluated using a current-voltage electrometer Keithley 2400 and a luminance spectrometer (Minolta Cs-1000A). The results are shown in Table 2. In Table 2, the lifetime ($T_{95}$) was measured as the time taken until a measured initial luminance (assumed as 100%) of the organic light-emitting device at 1000 nit is reduced to 95%. The driving voltage, current efficiency, and lifetimes characteristics of the organic light-emitting devices of Examples 1 to 2 and Comparative Example 1 are relative values with respect to the values of the organic light-emitting device of Example 1 each assumed as "100."

TABLE 2

| Example | Dopant | Driving voltage (V) (Relative value) | Current efficiency (cd/A) (Relative value) | $\lambda_{max}$ (nm) | Lifetime (hr) ($T_{95}$, at 1,000 nit) (Relative value) |
|---|---|---|---|---|---|
| Example 1 | Compound 2 | 100 | 100 | 636 | 100 |
| Example 2 | Compound 3 | 104 | 92 | 640 | 112 |
| Comparative Example 1 | Compound A | 170 | 86 | 535 | 9 |

Referring to Table 2, the organic light-emitting devices of Examples 1 and 2 were found to have improved driving voltage, current efficiency, color purity and lifetime characteristics, compared to those of the organic light-emitting device of Comparative Example 1.

As described above, according to the one or more embodiments, an organometallic compound represented by Formula 1 may have improved electric characteristics and good thermal stability. Therefore, an organic light-emitting device using the organometallic compound may have improved driving voltage, efficiency, and lifetime characteristics.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims.

What is claimed is:
1. An organometallic compound represented by Formula 1:

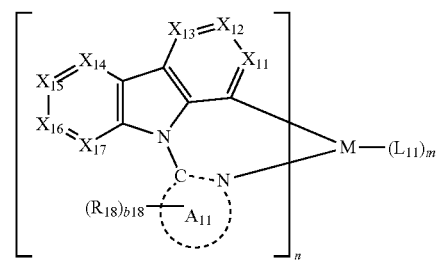

wherein, in Formula 1,
M is selected from a first-row transition metal, a second-row transition metal, and a third-row transition metal;
$A_{11}$ is selected from a $C_3$-$C_{14}$ heterocyclic group condensed with a 6-membered ring group and a $C_3$-$C_{14}$ heterocyclic group condensed with a 5-membered ring group,
the $C_3$-$C_{14}$ heterocyclic group is selected from a pyrrole group, a pyrazole group, an imidazole group, a thiazole group, an isothiazole group, an oxazole group, an iso-oxazole group, a pyridine group, a pyrimidine group, a pyrazine group, a triazine group, a thiazine group, an oxazine group, a quinoline group, an isoquinoline group, a cinnoline group, a quinazoline group, a quinoxaline group, 1,5-naphthyridine group, 1,6-naphthyridine group, 1,7-naphthyridine group, 1,8-naphthyridine group, a phthalazine group, 2,6-naphthyridine group, and 2,7-naphthyridine group, the 6-membered ring group is selected from a benzene group, a cyclohexane group, a cyclohexene group, a pyridine group, a piperidine group, a pyrazine group, a hexahydropyrimidine group, a tetrahydropyrazine group, and a piperazine group, and the 5-membered ring group is selected from a cyclopentene group, a cyclopentadiene group, a dihydropyrrole group, a pyrrole group, an imidazole group, and a pyrrolidine group;
$X_{11}$ is N, $X_{12}$ is $CR_{12}$, $X_{13}$ is $CR_{13}$, $X_{14}$ is $CR_{14}$, $X_{15}$ is $CR_{15}$, $X_{16}$ is $CR_{16}$, and $X_{17}$ is $CR_{17}$;
$X_{11}$ is $CR_{11}$, $X_{12}$ is N, $X_{13}$ is $CR_{13}$, $X_{14}$ is $CR_{14}$, $X_{15}$ is $CR_{15}$, $X_{16}$ is $CR_{16}$, and $X_{17}$ is $CR_{17}$;
$X_{11}$ is $CR_{11}$, $X_{12}$ is $CR_{12}$, $X_{13}$ is N, $X_{14}$ is $CR_{14}$, $X_{15}$ is $CR_{15}$, $X_{16}$ is $CR_{16}$, and $X_{17}$ is $CR_{17}$;
$X_{11}$ is $CR_{11}$, $X_{12}$ is $CR_{12}$, $X_{13}$ is $CR_{13}$, $X_{14}$ is N, $X_{15}$ is $CR_{15}$, $X_{16}$ is $CR_{16}$, and $X_{17}$ is $CR_{17}$;
$X_{11}$ is $CR_{11}$, $X_{12}$ is $CR_{12}$, $X_{13}$ is $CR_{13}$, $X_{14}$ is $CR_{14}$, $X_{15}$ is N, $X_{16}$ is $CR_{16}$, and $X_{17}$ is $CR_{17}$;
$X_{11}$ is $CR_{11}$, $X_{12}$ is $CR_{12}$, $X_{13}$ is $CR_{13}$, $X_{14}$ is $CR_{14}$, $X_{15}$ is $CR_{15}$, $X_{16}$ is N, and $X_{17}$ is $CR_{17}$;
$X_{11}$ is $CR_{11}$, $X_{12}$ is $CR_{12}$, $X_{13}$ is $CR_{13}$, $X_{14}$ is $CR_{14}$, $X_{15}$ is $CR_{15}$, $X_{16}$ is $CR_{16}$, and $X_{17}$ is N; or
$X_{11}$ is $CR_{11}$, $X_{12}$ is $CR_{12}$, $X_{13}$ is $CR_{13}$, $X_{14}$ is $CR_{14}$, $X_{15}$ is $CR_{15}$, $X_{16}$ is $CR_{16}$, and $X_{17}$ is $CR_{17}$;
$R_{11}$ to $R_{18}$ are each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C(=O)($Q_1$), —N($Q_1$)($Q_2$), and —Si($Q_1$)($Q_2$)($Q_3$), wherein at least two adjacent groups of $R_{11}$ to $R_{17}$ are optionally linked to each other to form a saturated or unsaturated ring;

$Q_1$ to $Q_3$ are each independently selected from a hydrogen, deuterium, a substituted or unsubstituted $C_1$-$C_{10}$ alkyl group, and a substituted or unsubstituted $C_6$-$C_{60}$ aryl group;

b18 is selected from 1, 2, 3, 4, 5, 6, 7, and 8;

n is 1, 2, 3, and 4;

$L_{11}$ is selected from a monodentate ligand or a bidentate ligand selected from the group consisting of an oxalate, an acetylacetonate, a picolinic acid, a 2-(2-hydroxyphenyl)-pyridine, 2-phenylpyridine, a 1,2-bis(diphenylphosphino)ethane, a 1,1-bis(diphenylphosphino)methane, a glycinate, an ethylenediamine, a 2,2'-bipyridine, a 1,10-phenanthroline and ligands represented by Formulae 2-1 to 2-3;

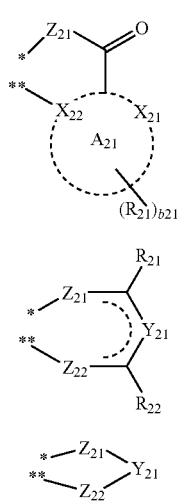

wherein, in Formulae 2-1 to 2-3, $A_{21}$ is selected from a $C_5$-$C_{20}$ carbocyclic group and a $C_1$-$C_{20}$ heterocyclic group;

$X_{21}$ and $X_{22}$ are each independently selected from C and N;

$Y_{21}$ is selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group;

$Z_{21}$ and $Z_{22}$ are each independently selected from N, O, N($R_{25}$), P($R_{25}$)($R_{26}$), and As($R_{25}$)($R_{26}$);

$R_{21}$ to $R_{26}$ are each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group;

b21 is selected from 1, 2, and 3; and

* and *' are each independently a binding site with an adjacent atom; and m is selected from 0, 1, 2, 3, 4, 5, and 6.

2. The organometallic compound of claim 1, wherein M is selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm).

3. The organometallic compound of claim 1, wherein M is selected from Ir, Pt, and Os.

4. The organometallic compound of claim 1, wherein $A_{11}$ is selected from a quinoline group, an isoquinoline group, a cinnoline group, a quinazoline group, a quinoxaline group, 1,5-naphthyridine group, 1,6-naphthyridine group, 1,7-naphthyridine group, 1,8-naphthyridine group, a phthalazine group, 2,6-naphthyridine group, 2,7-naphthyridine group, an indole group, an isoindole group, a benzimidazole group, a benzothiazole group, a benzisothiazole group, a benzoxazole group, a benzisoxazole group, a benzothiazine group, a benzoxazine group, a benzoquinoline group, a benzisoquinoline group, a phenanthroline group, and a phenanthridine group.

5. The organometallic compound of claim 1, wherein $A_{11}$ is selected from a quinoline group, an isoquinoline group, a quinazoline group, a quinoxaline group, 1,5-naphthyridine group, 1,6-naphthyridine group, 1,7-naphthyridine group, 1,8-naphthyridine group, a phthalazine group, 2,6-naphthyridine group, 2,7-naphthyridine group, an indole group, an isoindole group, a benzimidazole group, a benzothiazole group, a benzisothiazole group, a benzoxazole group, a benzisoxazole group, a benzothiazine group, and a benzoxazine group.

6. The organometallic compound of claim 1, wherein $A_{11}$ is selected from a quinoline group, an isoquinoline group, and a benzimidazole group.

7. The organometallic compound of claim 1, wherein $X_{11}$ is $CR_{11}$, $X_{12}$ is $CR_{12}$, $X_{13}$ is $CR_{13}$, $X_{14}$ is $CR_{14}$, $X_{15}$ is $CR_{15}$, $X_{16}$ is $CR_{16}$, and $X_{17}$ is $CR_{17}$; or $X_{11}$ is $CR_{11}$, $X_{12}$ is $CR_{12}$, $X_{13}$ is $CR_{13}$, $X_{14}$ is $CR_{14}$, $X_{15}$ is $CR_{15}$, $X_{16}$ is $CR_{16}$, and $X_{17}$ is N.

8. The organometallic compound of claim 1, wherein $R_{11}$ to $R_{18}$ are each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a $C_1$-$C_{20}$ alkyl group and a $C_1$-$C_{20}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, and —C(=O)(Q$_1$), —Si(Q$_1$)(Q$_2$)(Q$_3$), and —N(Q$_1$)(Q$_2$), wherein Q$_1$ to Q$_3$ are each independently selected from substituted or unsubstituted C$_1$-C$_{20}$ alkyl groups.

9. The organometallic compound of claim 1, wherein R$_{11}$ to R$_{18}$ are each independently selected from hydrogen, deuterium, —F, —Cl, —Br, —I, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, an n-butoxy group, and a tert-butoxy group, a C$_1$-C$_{20}$ alkyl group and a C$_1$-C$_{20}$ alkoxy group, each substituted with at least one of deuterium, —F, —Cl, —Br, —I, a cyano group, a phenyl group, and a naphthyl group;

a phenyl group and a naphthyl group;

a phenyl group and a naphthyl group, each substituted with at least one of deuterium, —F, —Cl, —Br, —I, —CD$_3$, —CD$_2$H, —CDH$_2$, —CF$_3$, —CF$_2$H, —CFH$_2$, a cyano group, a methyl group, an ethyl group, an n-propyl group, an iso-propyl group, an n-butyl group, an iso-butyl group, a sec-butyl group, a tert-butyl group, a methoxy group, an ethoxy group, an n-propoxy group, an iso-propoxy group, an n-butoxy group, a tert-butoxy group, a phenyl group, and a naphthyl group; and —Si(Q$_1$)(Q$_2$)(Q$_3$), wherein Q$_1$ to Q$_3$ are each independently selected from a methyl group, an ethyl group, an n-propyl group, an iso-propyl group, an n-butyl group, an iso-butyl group, a sec-butyl group, and a tert-butyl group.

10. The organometallic compound of claim 1, wherein n is selected from 1, 2, and 3.

11. The organometallic compound of claim 1, wherein L$_{11}$ is a ligand represented by one of Formulae 2-1 to 2-5:

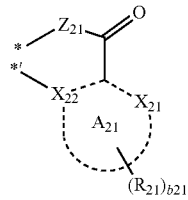

2-1

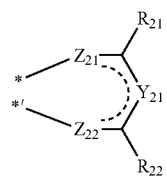

2-2

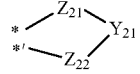

2-3

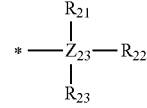

2-4

2-5 wherein, in Formulae 2-1 to 2-5,

A$_{21}$ is selected from a C$_5$-C$_{20}$ carbocyclic group and a C$_1$-C$_{20}$ heterocyclic group;

X$_{21}$ and X$_{22}$ are each independently selected from C and N;

Y$_{21}$ is selected from a single bond, a double bond, a substituted or unsubstituted C$_1$-C$_5$ alkylene group, a substituted or unsubstituted C$_2$-C$_5$ alkenylene group, and a substituted or unsubstituted C$_6$-C$_{10}$ arylene group;

Z$_{21}$ and Z$_{22}$ are each independently selected from N, O, N(R$_{25}$), P(R$_{25}$)(R$_{26}$), and As(R$_{25}$)(R$_{26}$);

Z$_{23}$ is selected from phosphorus (P) and arsenic (As);

R$_{21}$ to R$_{26}$ are each independently selected from a hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, and a C$_1$-C$_{20}$ alkoxy group, a C$_1$-C$_{20}$ alkyl group and a C$_1$-C$_{20}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group;

b21 is selected from 1, 2, and 3; and

* and *' are each independently a binding site with an adjacent atom.

12. The organometallic compound of claim 1, wherein $L_{11}$ is a ligand represented by one of Formulae 3-1 to 3-6:

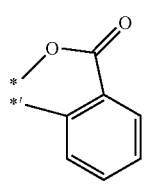

3-1

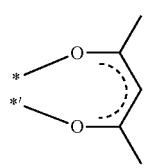

3-2

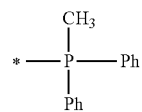

3-3

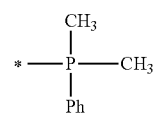

3-4

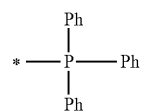

3-5

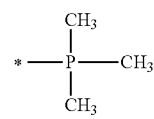

3-6 wherein, in Formulae 3-1 to 3-6,

Ph is a phenyl group; and

* and *' are binding sites with an adjacent atom.

13. The organometallic compound of claim 1, wherein m is selected from 0, 1, 2, 3, and 4.

14. The organometallic compound of claim 1, wherein the organometallic compound of Formula 1 is represented by one of Formulae 1-1 to 1-4:

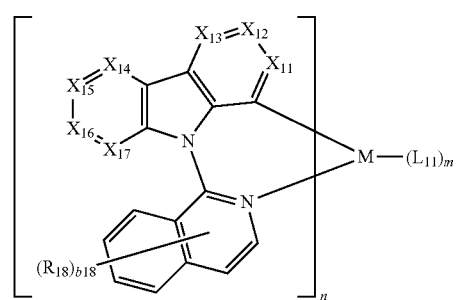

1-1

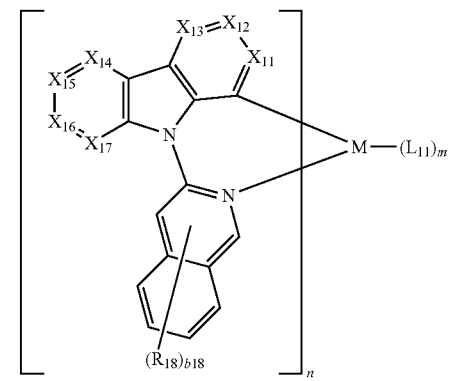

1-2

1-3
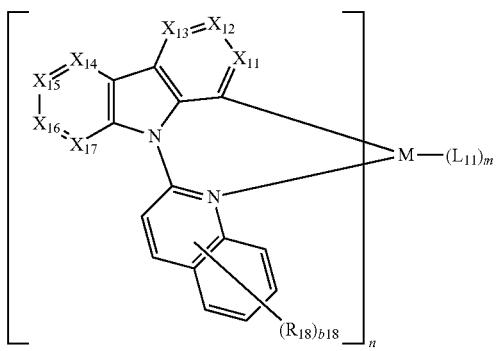
1-4
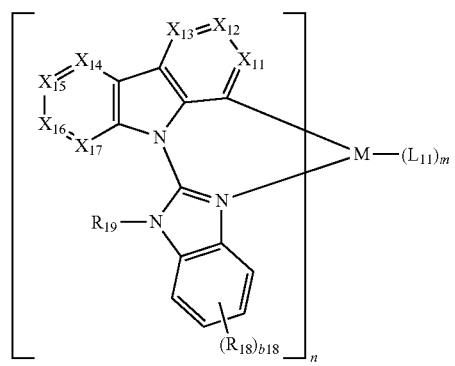
wherein, in Formulae 1-1 to 1-4,
M, X$_7$ to X$_{17}$, R$_{18}$, b18, n, L$_{11}$, and m are the same as those in Formula 1; and
R$_{19}$ is the same as R$_{18}$ in Formula 1.
15. The organometallic compound of claim 1, wherein the organometallic compound of Formula 1 is represented by one of Formulae 1-11 to 1-18:
1-11
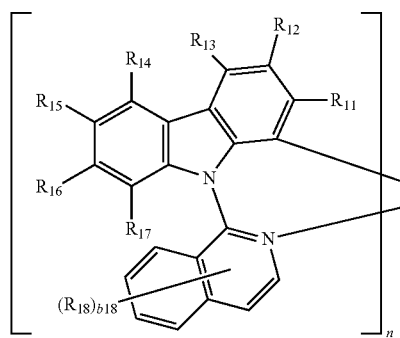
1-12
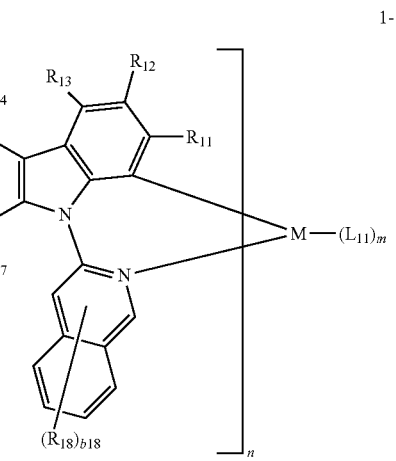
1-13
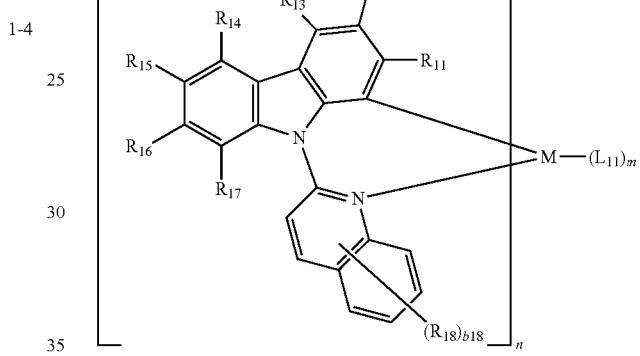
1-14
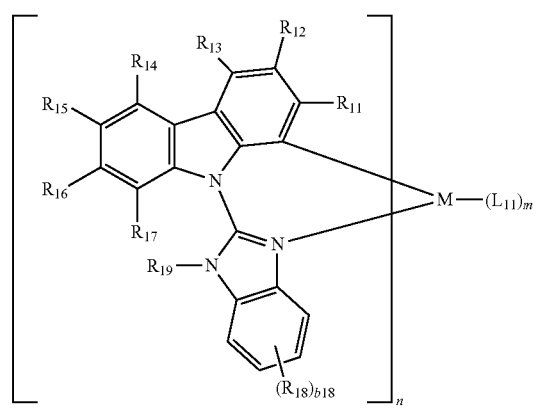
1-15
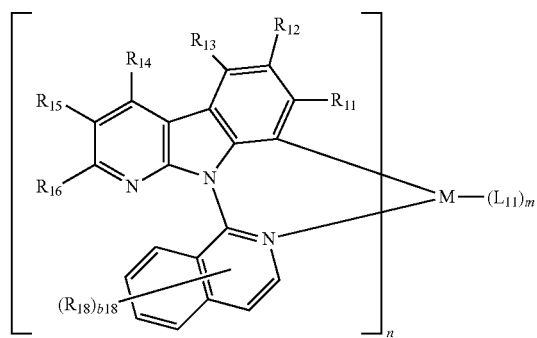

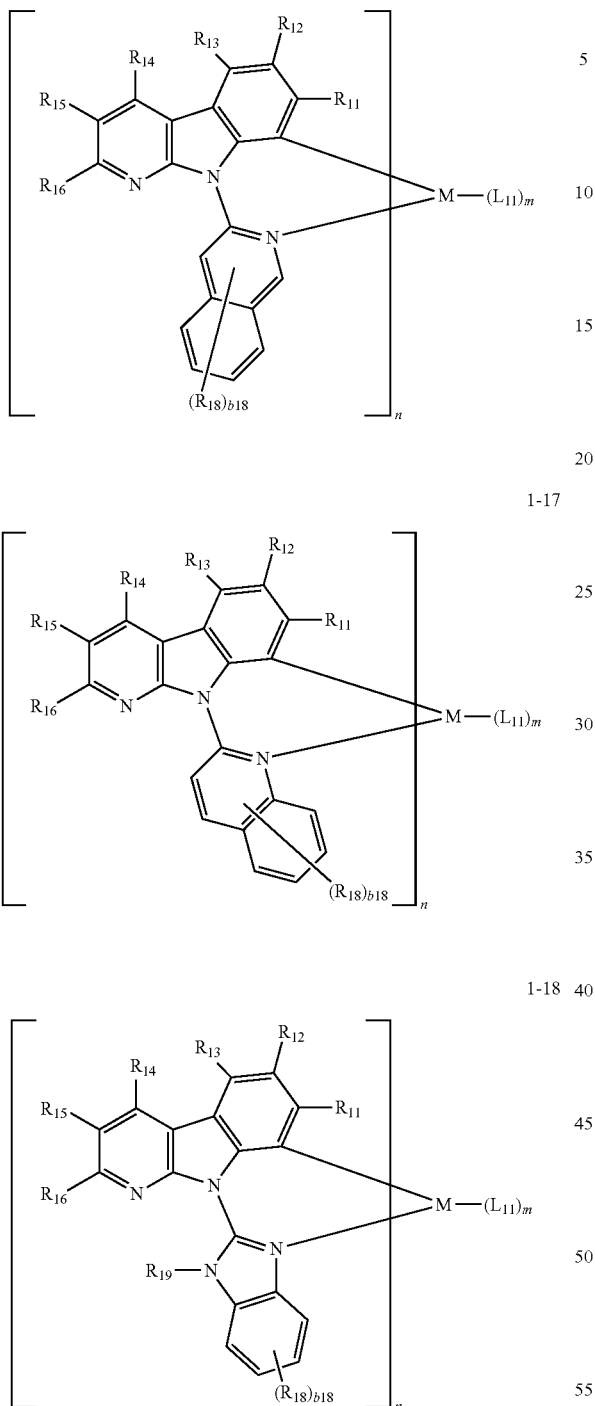
wherein, in Formulae 1-11 to 1-18,
M, $R_{11}$ to $R_{18}$, b18, n, $L_{11}$, and m are the same as those in Formula 1; and
$R_{19}$ is the same as $R_{18}$ in Formula 1.
16. The organometallic compound of claim 1, wherein the organometallic compound of Formula 1 is selected from Compounds 1 to 30:
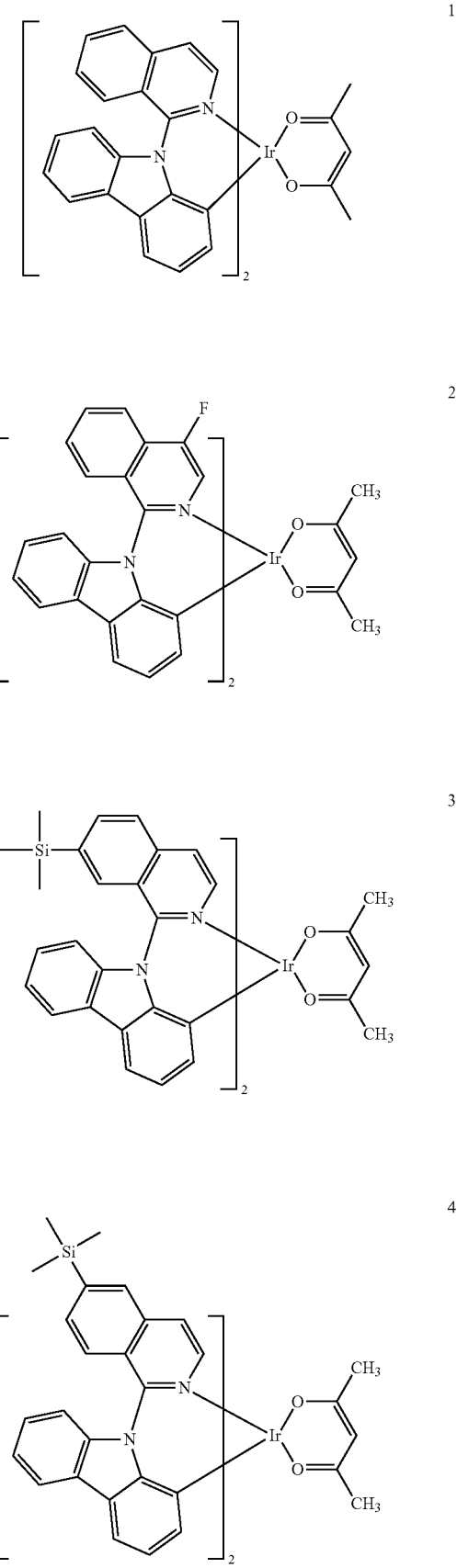

5
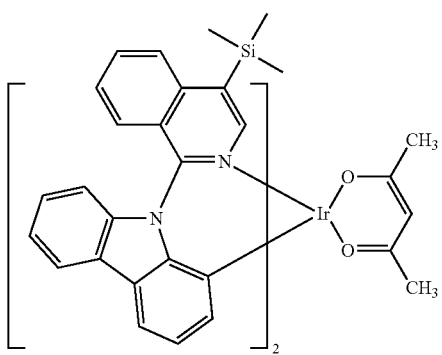
6
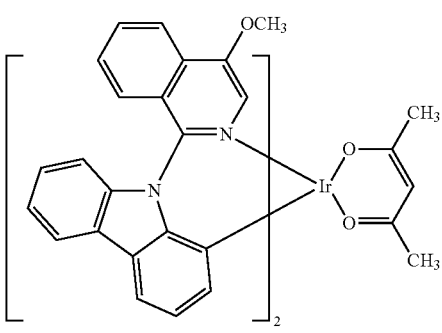
7
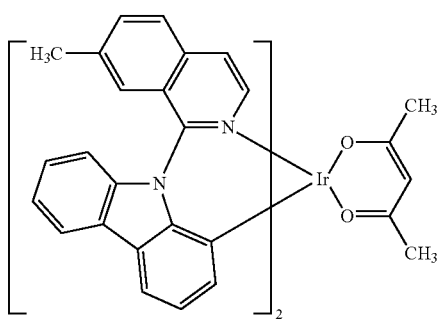
8
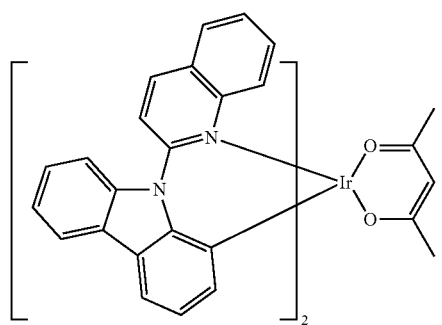
9
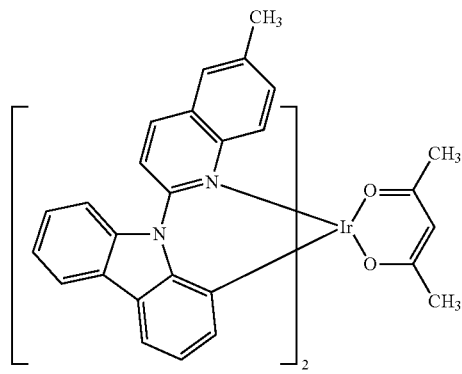
10
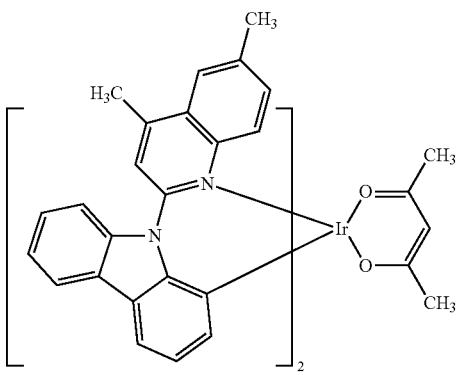
11
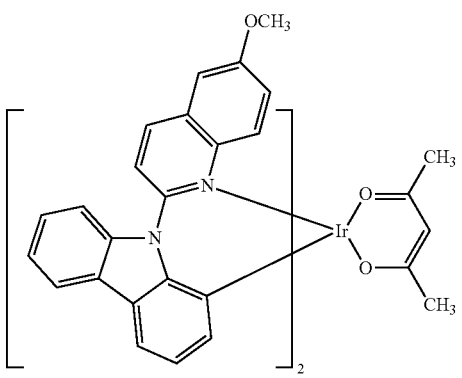
12
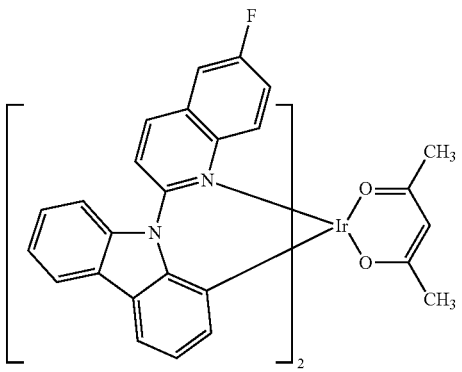

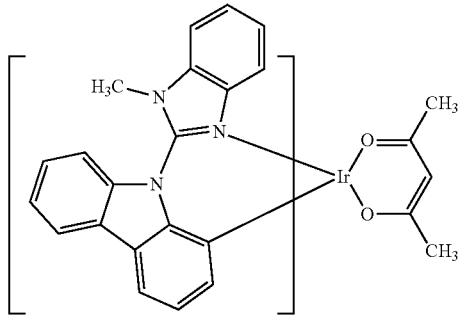
13
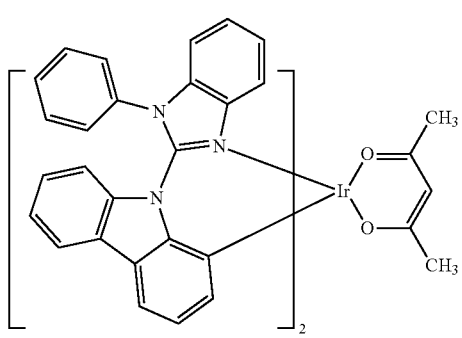
14
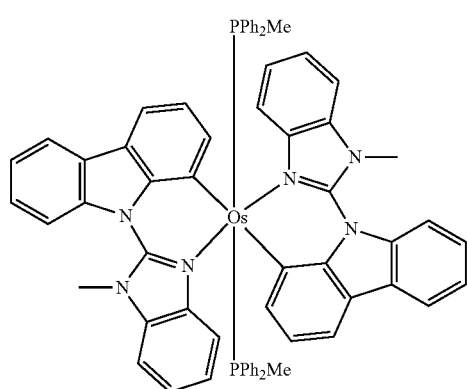
15
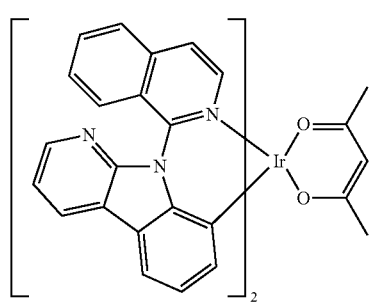
16
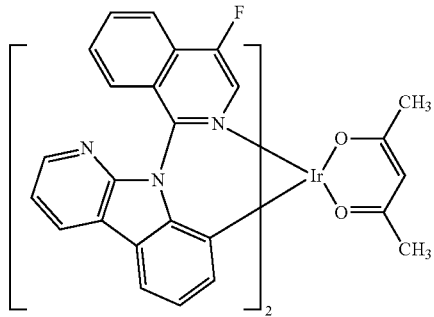
17
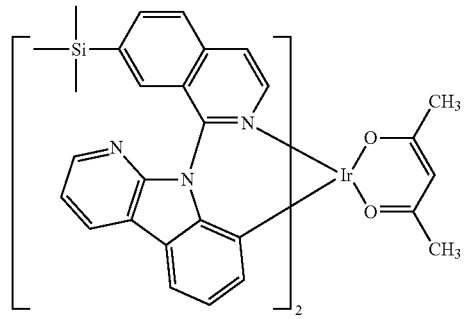
18
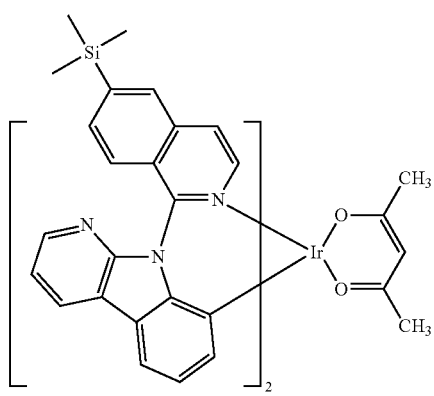
19
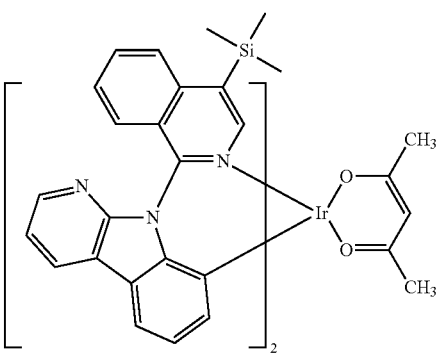
20

21
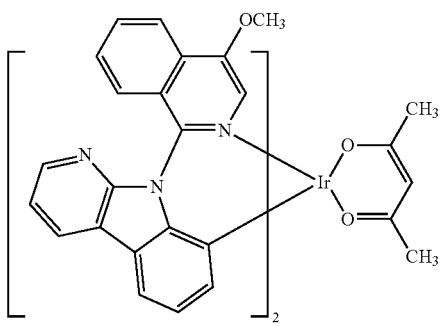
22
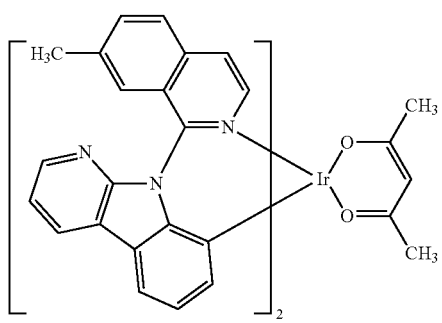
23
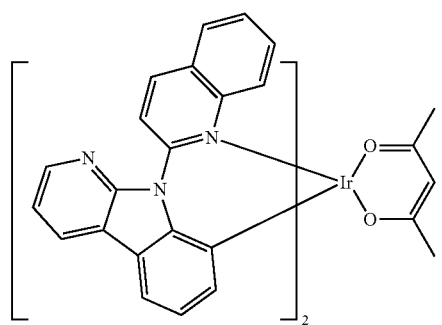
24
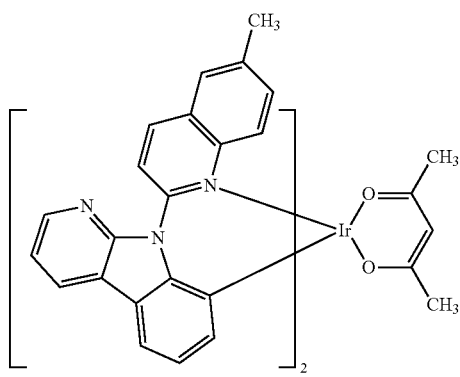
25
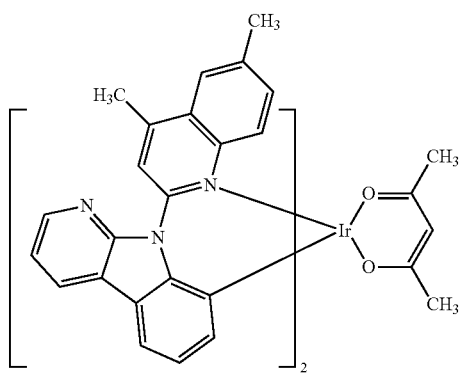
26
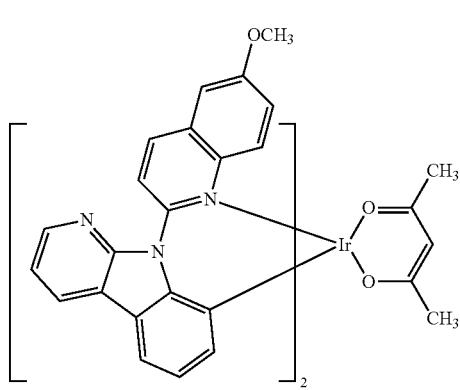

27

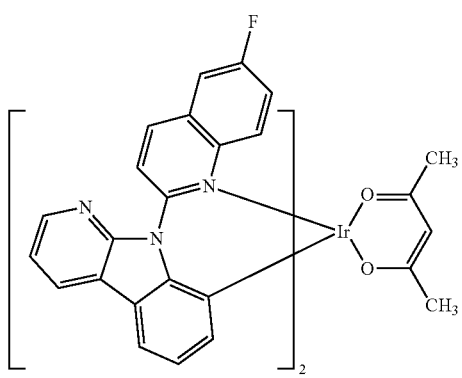

28

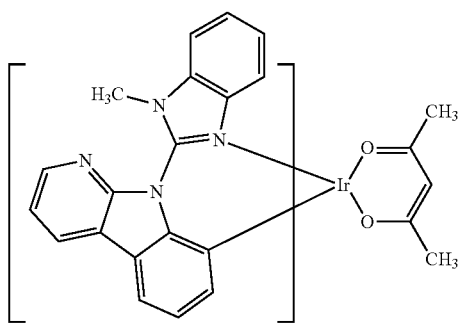

29

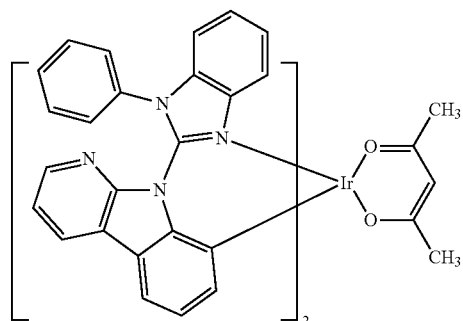

30

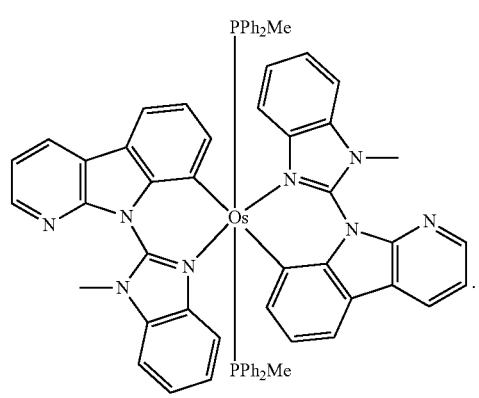

17. An organic light-emitting device comprising:
a first electrode;
a second electrode; and
an organic layer disposed between the first electrode and the second electrode,
wherein the organic layer comprises an emission layer and at least one organometallic compound represented by Formula 1 of claim 1.

18. The organic light-emitting device of claim 17, wherein the emission layer comprises the at least one organometallic compound.

* * * * *